(12) United States Patent
Masson et al.

(10) Patent No.: US 8,378,209 B2
(45) Date of Patent: Feb. 19, 2013

(54) SOLAR CELL AND METHOD OF FABRICATION THEREOF

(75) Inventors: Denis Paul Masson, Ottawa (CA); Simon Fafard, Ottawa (CA); Eric Desfonds, Laval (CA)

(73) Assignee: Cyrium Technologies Incorporated, Ottawa, Ontario (CA)

( * ) Notice: Subject to any disclaimer, the term of this patent is extended or adjusted under 35 U.S.C. 154(b) by 140 days.

(21) Appl. No.: 12/840,523

(22) Filed: Jul. 21, 2010

(65) Prior Publication Data

US 2011/0023958 A1 Feb. 3, 2011

Related U.S. Application Data

(60) Provisional application No. 61/229,548, filed on Jul. 29, 2009.

(51) Int. Cl.
*H01L 31/00* (2006.01)

(52) U.S. Cl. .......................... 136/261; 136/252

(58) Field of Classification Search .......... 136/261–262
See application file for complete search history.

(56) References Cited

U.S. PATENT DOCUMENTS

| | | | |
|---|---|---|---|
| 4,244,348 A * | 1/1981 | Wilkes ..................... | 125/23.01 |
| 4,332,973 A * | 6/1982 | Sater .......................... | 136/246 |
| 5,217,539 A | 6/1993 | Fraas et al. | |
| 5,933,705 A | 8/1999 | Geels et al. | |
| 6,252,287 B1 | 6/2001 | Kurtz et al. | |
| 6,879,014 B2 * | 4/2005 | Wagner et al. ............... | 257/458 |
| 2002/0040727 A1 * | 4/2002 | Stan et al. .................... | 136/255 |
| 2004/0079408 A1 * | 4/2004 | Fetzer et al. ................. | 136/262 |
| 2007/0079863 A1 | 4/2007 | Stan et al. | |
| 2008/0035939 A1 * | 2/2008 | Puetz et al. .................... | 257/94 |
| 2009/0188561 A1 * | 7/2009 | Aiken et al. .................. | 136/259 |
| 2009/0277314 A1 * | 11/2009 | Henley ............................. | 83/15 |

OTHER PUBLICATIONS

International Patent Application No. PCT/CA2010/001121, International Search Report dated Oct. 4, 2010.

* cited by examiner

*Primary Examiner* — Miriam Berdichevsky

(74) *Attorney, Agent, or Firm* — Louis B. Allard; Borden Ladner Gervais LLP

(57) ABSTRACT

A solar cell and a method of fabricating solar cells. The method includes a step of separating neighbor solar cells formed on a semiconductor wafer by scribing the wafer to form scribe lines on the wafer and applying a force at, or adjacent to, the scribed lines to separate the solar cells. The scribing is effected on a cap layer covering a window layer of solar cells, thereby minimizing damage to the window layer and mitigating propagation of defects into p-n junctions formed in the solar cells.

7 Claims, 14 Drawing Sheets

SOLAR CELL AND METHOD OF FABRICATION THEREOF

CROSS REFERENCE TO RELATED APPLICATIONS

This application claims the benefit of priority of U.S. Provisional Patent Application No. 61/229,548 filed Jul. 29, 2009, which is incorporated herein by reference in its entirety.

FIELD OF THE INVENTION

The present invention relates generally to solar cells and to the manufacture thereof. In particular, the present invention relates to solar cells that have a structure that produces increased solar cell performance metrics.

BACKGROUND OF THE INVENTION

Solar cells must undergo numerous manufacturing steps during fabrication. Great care is usually required at each of these steps to ensure that the solar cells meet their target specifications (performance metrics), such specifications including, amongst others, conversion efficiency, open circuit voltage, short circuit current density, and fill factor.

The field of concentrated photovoltaics (CPV), or concentrator photovoltaics, where sunlight is focused (concentrated) on solar cells, has been the focus of much research, development, and commercial activities recently. One of the goals of CPV is to generate more power out of smaller size solar cells. This requires high efficiency solar cells having a small area. Exemplary dimensions of solar cells for CPV can range from, for example, 15 mm×15 mm to 1 mm×1 mm or less.

Typically, multi-junction solar cells for CPV are epitaxially grown on a same semiconductor wafer and are subsequently separated from each other by sawing the wafer along pre-determined sawing lanes or cutting lanes. One of the disadvantages of sawing the semiconductor wafer is that sawing will typically create defects along the saw cut, at the perimeter of the solar cells. Photo-generated carriers, namely, electrons and holes, which are within a diffuse length of such defects, can diffuse to the defects and become trapped, or recombine, at the defects, thereby degrading the performance metrics of the solar cells. Chemical and surface passivation, such as wet etch or SiN plasma-enhanced chemical vapor deposition, can be used to remove or passivate these defects; however, it is likely that a portion of the defects will remain. Further, the chemicals used in some passivation processes are environmentally-unfriendly and their disposal is costly.

The decrease in the performance metrics of the solar cell and can be particularly felt in small solar cell made of high quality material, which provides long diffusion lengths for the photo-generated carriers. Such long diffusion lengths allow a considerable fraction of the photo-generated carriers to reach the perimeter of the solar cell to recombine (or become trapped) at a defect created by the sawing process. In the past, high efficiency solar cells have been used primarily in space applications, e.g., to power satellites. In such applications, the solar cells have a large surface area and there is essentially less, or no concern with respect to recombination of photo-generated carriers at defects on the perimeter of devices. Any such recombination has a negligible effect on the conversion efficiency, as the fraction of photo-generated carriers recombining at defects on the perimeter of the solar cell is small.

Another disadvantage is that the provision of sawing lanes on the semiconductor wafer, between solar cells, as well as the saw kerf, accounts for a sizeable portion of the wafer upon which the solar cells are formed. The material present in the sawing lane ultimately goes to waste instead of being used to convert light into electricity. This problem is exacerbated in small size solar cells, as the fraction of wasted material is higher when solar cells have a small surface area, i.e., when the ratio of cutting lane surface area to solar cell surface area is large. An additional disadvantage of sawing semiconductors wafers can generate residue that contains environmentally-unfriendly constituents. For example, in the case of III-V solar cells, that is, solar cells made of material comprising elements of groups III and V of the periodic table of the elements, the sawing process will generate residue that can contain arsenic, gallium, phosphorous, etc. The disposal of such residue is costly.

Improvements in solar cells are therefore desirable.

SUMMARY OF THE INVENTION

In a first aspect, the present disclosure provides a solar cell made of semiconductor materials, the solar cell having a crystalline structure with crystal planes. The solar cell comprises a germanium substrate; a least one p-n junction formed atop the germanium substrate, the at least one p-n junction including group III elements and group V elements; a solar cell window layer formed atop the at least one p-n junction; a cap layer formed atop the solar cell window layer, the cap layer being electrically connected to the solar cell window layer; and a sidewall extending along a height of the cap layer and towards the germanium substrate, the sidewall having a cleaved surface, the cleaved surface being substantially parallel to a cleaving plane of the solar cell, the cleaving plane being substantially parallel to a crystal plane of the solar cell.

The cap layer may be a patterned cap layer that exposes a light-input portion of the solar cell window layer. The solar cell may further comprise a metal layer formed on a portion of the patterned cap layer. A portion of the metal layer may define a busbar of the solar cell. The solar cell window layer may include aluminum indium phosphide, the cap layer may include gallium arsenide, and at least one of the at least one p-n junction may includes indium gallium arsenide. The cap layer may further include indium. The solar cell may be such that at least one p-n junction, the solar cell window layer, and the cap layer are pseudomorphic with the germanium substrate. The solar cell may further comprise a side piece adjacent the sidewall; and a metal layer formed on a portion of the patterned cap layer and on a portion of the side piece, the metal layer defining a busbar of the solar cell, the busbar bridging the side piece and the patterned cap layer. The side piece may be an electrical insulator piece. The electrical insulator piece may include at least one of alumina, aluminum nitride, beryllium oxide, glass, BK7, quartz, sapphire, borosilicate glass, mullite, steatite, forsterite, zirconia, boron nitride, polymers, polyvinyl chloride, poly-methyl methacrylate, and benzocyclobutant. The solar piece may include semi-insulating silicon. The solar cell may further comprise an electrical insulator layer formed on a portion of the patterned cap layer; and a metal layer formed on a portion of the electrical insulator layer to define a busbar of the solar cell, the metal layer also formed on a portion of the patterned cap layer. The solar cell may further comprise an electrical insulator layer formed on a portion of the patterned cap layer; a side piece adjacent the sidewall; and a metal layer formed on a portion of the electrical insulator layer and on a portion of the side piece, the metal layer defining a busbar of the solar cell, the busbar bridging the side piece and the electrical insulator layer. The germanium may be a vicinal substrate having a vicinal angle comprised between 0° and 20°.

In a second aspect, the present disclosure provides a solar cell made of semiconductor materials, the solar cell having a crystalline structure with crystal planes, the solar cell comprising: a germanium substrate; a least one p-n junction formed atop the germanium substrate, the at least one p-n junction including group III elements and group V elements; a solar cell window layer formed atop the at least one p-n junction; a patterned cap layer formed atop the solar cell window layer, the patterned cap layer being electrically connected to the solar cell window layer, the patterned cap layer exposing a light-input portion of the solar cell window layer; a sidewall extending along a height of the patterned cap layer and towards the germanium substrate; a side piece adjacent the sidewall; and a metal layer formed on a portion of the patterned cap layer and on a portion of the side piece, the metal layer defining a busbar of the solar cell, the busbar bridging the side piece and the patterned cap layer.

The sidewall may have a cleaved surface, the cleaved surface being substantially parallel to a cleaving plane of the solar cell, the cleaving plane being substantially parallel to a crystal plane of the solar cell.

In a third aspect the present disclosure provides a solar cell made of semiconductor materials, the solar cell having a crystalline structure with crystal planes, the solar cell comprising: a germanium substrate; a least one p-n junction formed atop the germanium substrate, the at least one p-n junction including group III elements and group V elements; a solar cell window layer formed atop the at least one p-n junction; a patterned cap layer formed atop the solar cell window layer, the patterned cap layer being electrically connected to the solar cell window layer, the patterned cap layer exposing a light-input portion of the solar cell window layer; an electrical insulator layer formed on a portion of the patterned cap layer; a sidewall extending along a height of the patterned cap layer and towards the germanium substrate; a side piece adjacent the sidewall; and a metal layer formed on a portion of the electrical insulator layer and on a portion of the side piece, the metal layer defining a busbar of the solar cell, the busbar bridging the side piece and the electrical insulator layer. The sidewall may have a cleaved surface, the cleaved surface being substantially parallel to a cleaving plane of the solar cell, the cleaving plane being substantially parallel to a crystal plane of the solar cell.

In a fourth aspect, the present disclosure provides a solar cell made of semiconductor materials, the solar cell having a crystalline structure with crystal planes, the solar cell comprising: a germanium substrate; a least one p-n junction formed atop the germanium substrate, the at least one p-n junction including group III elements and group V elements; a solar cell window layer formed atop the at least one p-n junction; a patterned cap layer formed atop the solar cell window layer, the patterned cap layer being electrically connected to the solar cell window layer, the patterned cap layer exposing a light-input portion of the solar cell window layer; an electrical insulator layer formed atop the solar cell window layer, adjacent the patterned cap layer; a sidewall extending along a height of the electrical insulator layer and towards the germanium substrate; a side piece adjacent the sidewall; and a metal layer formed on a portion of the electrical insulator layer, on a portion of the side piece, and on a portion of the patterned cap layer, the metal layer defining a busbar of the solar cell, the busbar bridging the side piece, the insulator, and the patterned cap layer.

The sidewall may have a cleaved surface, the cleaved surface being substantially parallel to a cleaving plane of the solar cell, the cleaving plane being substantially parallel to a crystal plane of the solar cell.

In a fifth aspect, the present disclosure provides a solar cell made of semiconductor materials, the solar cell having a crystalline structure with crystal planes, the solar cell comprising: a germanium substrate; a least one p-n junction formed atop the germanium substrate, the at least one p-n junction including group III elements and group V elements; a solar cell window layer formed atop the at least one p-n junction; a patterned cap layer formed atop the solar cell window layer, the patterned cap layer being electrically connected to the solar cell window layer, the patterned cap layer exposing a light-input portion of the solar cell window layer; an electrical insulator layer formed atop the solar cell window layer, adjacent the patterned cap layer; and a metal layer formed on a portion of the electrical insulator layer and on a portion of the patterned cap layer, the metal layer defining a busbar of the solar cell, the busbar bridging the electrical insulator layer and the patterned cap layer.

In a sixth aspect, the present disclosure provides a solar cell made of semiconductor materials, the solar cell having a crystalline structure with crystal planes, the solar cell comprising: a germanium substrate; a least one p-n junction formed atop the germanium substrate, the at least one p-n junction including group III elements and group V elements; a solar cell window layer formed atop the at least one p-n junction; a patterned cap layer formed atop the solar cell window layer, the patterned cap layer being electrically connected to the solar cell window layer, the patterned cap layer exposing a light-input portion of the solar cell window layer; an electrical insulator layer formed atop the patterned cap layer; and a metal layer formed on a portion of the electrical insulator layer and on a portion of the patterned cap layer, the metal layer defining a busbar of the solar cell, the busbar bridging the electrical insulator layer and the patterned cap layer.

In a seventh aspect, the present disclosure provides a method of manufacturing solar cells from a semiconductor wafer having epitaxially-grown layers formed on a germanium substrate, some of the epitaxially-grown layers defining a p-n junction formed atop the germanium substrate, the epitaxially-grown layers including a window layer formed atop the p-n junction, the epitaxially-grown layers also including a cap layer formed atop the window layer, the method comprising steps of: scribing the cap layer in a predetermined pattern along scribe lanes, to obtain scribe lines in the scribe lanes; and separating the semiconductor wafer along the scribe lines to obtain a plurality of solar cells. Scribing may be preceded by a step of securing the epitaxially-grown layers to a stretchable membrane, and the step of separating includes stretching the stretchable membrane.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
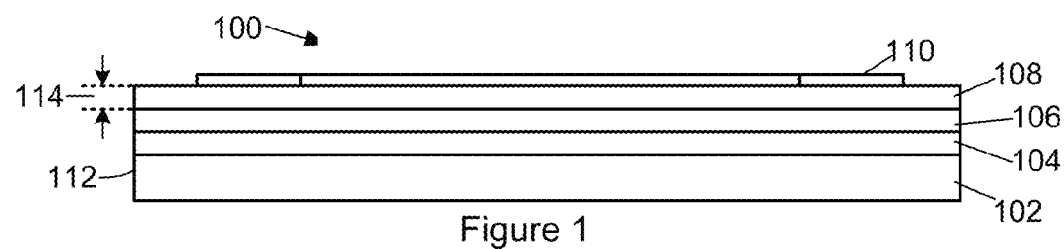
FIG. 1 shows a cross-sectional view of an exemplary solar cell of the present disclosure.

Generally, the present disclosure provides a semiconductor-based, crystalline solar cell that has sidewalls parallel to cleaving planes of the solar cell. The cleaving planes are substantially parallel to crystal planes of the solar cell. The sidewalls are formed by scribing a cap layer of the solar cell and by a cleaving operation. As such, the sidewalls have a low density of defects, for example, non-radiative recombination centers for the photo-generated carriers generated in the solar cell by light absorbed by the solar cell. Because of the high-quality sidewalls, the solar cell has improved performance metrics such as, for example, an improved conversion efficiency. The present disclosure also provides solar cells that increase the percentage of expensive semiconductor wafer (i.e., the wafer utilization efficiency is increased) used in a manufacturing process. The higher percentage of wafer use can be achieved by forming, at least partly, a busbar of the solar cell on a side piece placed adjacent to a sidewall of the solar cell.

Typically, a plurality of solar cells are produced simultaneously on a crystalline semiconductor substrate upon which is epitaxially grown a series of semiconductor materials that form, amongst other structures, one or more p-n junctions. The p-n junctions are used to generate a photovoltage by separating photo-generated carriers. A window layer, (or solar cell window layer), which is typically a semiconductor layer that has a high optical transparency in the wavelength range of interest (for example, transparent to most of the sunlight), but also has a good sheet conductivity to carry the current laterally, is grown on top of the one or more p-n junctions. As is known in the art, one of the roles of the window layer is to reflect minority carriers to prevent them from reaching the topmost part of the solar cell where they could recombine with majority carriers or be lost at surface recombination centers. Another function of the window layer is to allow light to enter its solar cell.

The photovoltage generated by the one or more p-n junctions of a solar cell can be used by electrically connecting the solar cell to any suitable load such as, for example, a power inverter connected to a power grid. To connect the solar cell to the load, electrical contacts are formed on the solar cell. A first contact will typically be formed by growing a highly-doped cap layer on the window followed by a patterned metal deposition on the cap layer. As such, the first contact is formed on a window-side of the one or more p-n junctions. The cap layer has to be removed in specific areas to expose the window layer to allow light to penetrate the solar cell. The cap layer may also be removed from the sawing lanes. A conductor wire or a conductor sheet connects the metal deposition to the load. A second contact is formed opposite the one or more p-n junctions, typically on the substrate-side of the solar cell, and is subsequently connected to the load to complete the circuit. The second contact can take the form of a highly doped semiconductor, an ohmic contact, a metal layer, a tunnel junction connecting to a p/n junction, or a combination of the above. The connection of the connector wires to the solar cell is usually done once the solar cell have been separated into dies and mounted on carriers. Such contacts can be made using similar processes whether the solar cell is a single junction solar cell or a multiple junction solar cell, or whether the solar cell is a pseudomorphic cell (i.e., same average lattice constants as the substrate and coherent to the substrate, that is, a single crystal solar cell), a metamorphic cell, and inverted metamorphic cell having a surrogate substrate or not.

FIG. 1 shows a cross-sectional view of an embodiment of a solar cell 100 of the present disclosure. The solar cell 100 is made of semiconductor materials, has a crystal structure and crystal planes. The solar cell 100 has a substrate 102, which can be, for example, a group IV substrate, such as a germanium substrate. A p-n junction 104 (or more than one p-n junction) is formed on the substrate 102, and a window layer 106 is formed on the p-n junction 104. Further, a cap layer 108 is formed on the window layer 106, and a metal layer 110 is formed on the cap layer. Although the present disclosure describes solar cells has having one p-n junction, solar cells with any number of p-n junctions formed between the substrate 102 and the window layer 106 are also within the scope of the present disclosure. Further, the present disclosure includes solar cells made of III-V binary, ternary, and/or quaternary alloys, as well as II-VI alloys, or group IV elemental or alloyed materials. Chalcogen semiconductors that can be grown in a suitable crystalline form, or a combination of alloys of the above-noted groups. Specifically, this includes elements or alloys or combinations form the following list: Si, Ge, SiGe, GaP, AlP, AlGaP, ZnS, ZnSe, ZnSeS, GaAs, AlAs, AlGaAs, MgS, InP, CdS, MgSe, GaInP, AlInP, AlGaInP, InGaAs, AlInGaAs, InGaAsP, AlGaAsP, AlInGaAsP, InAs, AlInAs, AlInAsP, GaSb, GaAsSb, AlAsSb, GaAlAsSb, AlInSb, GaInSb, AlInGaSb, CdSe, CdSSe, AlSb, ZnTe, MgTe, InSb, CdTe, InN, AlN, GaN, InGaN, AlGaN, InGaAlN, InGaAsN, InAlGaAsN, BN, BP, BAs, BSb, InGaAlPAsSb, BInGaAlNPAsSb, CuInGaS, CuInGaSe, $CdIn_2S_4$, $CdIn_2Se_4$, and others. As will be understood to the skilled worker, the order or the concentration of the alloys listed above can be changed or adjusted for the embodiments of interest. Moreover these alloys may contain low dimensionality homostructures, heterostructures, or nanostructures.

The solar cell has a sidewall 112 that extends along the height 114 of the cap layer 108, or along a portion of the height 114 of the cap layer 108, and towards the substrate 102. The sidewall 112 is formed in a scribe and cleave operation of a semiconductor wafer that includes the substrate 102, the p-n junction 104, the window layer 106, the cap layer 108 and, optionally, the metal layer 110. An example of such a wafer and an example of a scribe and cleave operation are described elsewhere in the disclosure. The sidewall 112, having been formed by a cleaving operation, is parallel to a cleaving plane of the solar cell 100 and, as the solar cell is a crystalline structure with crystal planes, the cleaving plane is parallel to a crystal plane of the solar cell 100. A cleaving plane may also be referred to as a cleavage plane. As is known in the art, photo-generated charge carriers (electrons and holes) can recombine radiatively in the solar cell 100 without contributing to any generation of current. Because the sidewall 112 is substantially free of defects, it can act as a mirror to reflect photoluminescence reaching the sidewall 112 towards the p-n junction 104 where the photoluminescence can be absorbed and generate a photocurrent. As such, the sidewall 112 can prevent photo-generated carriers from recombining non-radiatively or from becoming trap, and, can also reflect photoluminescence toward the p-n junction 104 where it can be absorbed and generate a photocurrent.

As will be disclosed in detail below, the separation of solar cells formed on a semiconductor wafer can be done by a scribe and cleave operation. The cleave operation can include a stretch operation. The scribing step is meant to scribe lines on the semiconductor wafer to weaken the semiconductor wafer along the scribe lines or initiate a break in a cleaving plane of interest. The scribe lines are substantially parallel to crystal planes of the semiconductor wafer. The stretching operation relates to stretching a stretchable membrane upon which the scribed semiconductor wafer is secured. When the stretchable membrane is stretched, the wafer will cleave (break, separate) along the scribed lines, and result in a plurality of solar cell dies having cleaved surface sidewalls, which are parallel to a crystal plane of the solar cell (semiconductor wafer). The advantage of having solar cells with such sidewalls is described below.

Figure 2:
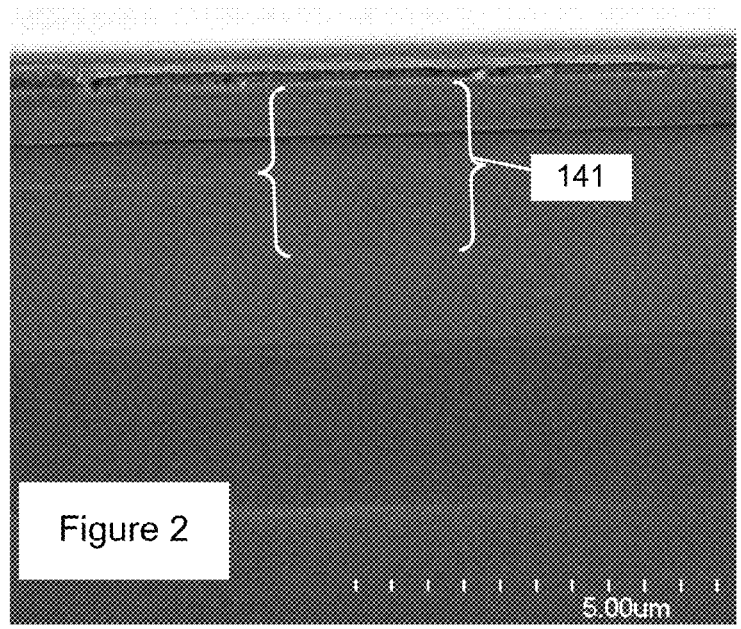
FIG. 2 shows a scanning electron microscope micrograph of solar cell having been scribed on its cap layer.
Figure 3:
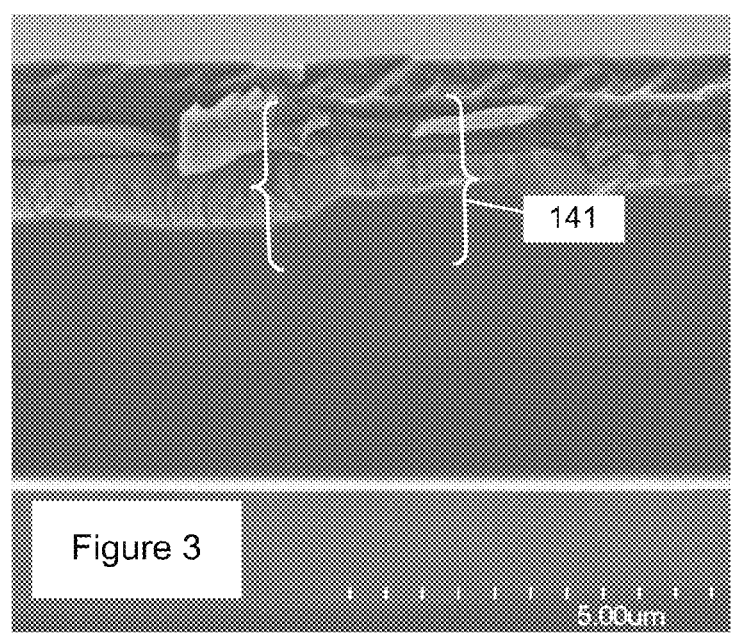
FIG. 3 shows a scanning electron microscope micrograph of solar cell having been scribed on its window layer layer.

FIG. 2 and FIG. 3 each show a 60° tilt scanning electron microscope (SEM) micrograph of a sidewall of a respective solar cell having undergone scribing using the same diamond scribing tool. The structure of the solar cell shown at FIG. 2 is similar to the structure shown at FIG. 1 in that the window layer of the solar cell of FIG. 2 has a cap layer as part of the sidewall. Scribing of the solar cell of FIG. 2 is effected on the cap layer, which, in this case, is made of gallium arsenide (GaAs). The solar cell shown at FIG. 3 does not have a cap layer as part of the sidewall. As such, scribing of the solar cell of FIG. 3 is effected on the window layer itself. In both FIG. 2 and FIG. 3, the structure in which are formed p-n junctions is indicated by the height of curly brackets 141. As is apparent from FIG. 2 and FIG. 3, more damage occurs in the solar having had its window layer scribed directly (FIG. 3) than in the solar cell having been scribed through a cap layer (FIG. 2). Further, as evidenced by FIG. 3, the damage in the solar cell having been scribed directly on its window layer extends well into the p-n junctions. In contrast to the solar cell of FIG. 3, there is no such damage extending into the p-n junctions of the solar cell of FIG. 2. As evidenced below, an absence of such damage leads to improved solar cell performance metrics.

As in known in the art, to obtain increased solar cell performance, it is preferred to use a semiconductor window material (window layer 106) that has a bandgap with an energy large enough to be transparent for most of the sunlight transmitted through it and well above the energy bandgap of the semiconductors used in the solar cell, but also preferably having a material lattice constant similar to the rest of the solar cell to avoid lattice defects (e.g., dislocations) in the solar cell. In the solar cells of FIG. 2 and of FIG. 3, the window layer is made of a ternary material, in this example, aluminum indium phosphide (AlInP), which is more brittle (fragile) than GaAs, which is used as the capping layer in the solar cell of FIG. 2. As observed, more damage occurs by cleaving on the AlInP layer than on the GaAs layer, which can be attributable to the different properties of these materials to resist fractures, or undergo ductile fractures, or cleave along well-defined planes or cleave more chaotically. As will be clear for the skilled worker, scribing directly on other potential window materials such as aluminum indium gallium phosphide (AlInGaP), zinc sellenide (ZnSe), aluminum phosphide (AlP), or other III-V or II-VI alloys that have a bandgap and lattice constant appropriate to be used as a window layer, is expected to result in similar behavior, that is, would be more subject to chaotic or random fractures than GaAs.

Table 1 shows open-circuit ($V_{OC}$) data taken for multiple solar cell dies obtained from a wafer having been scribed directly on its window layer (such as shown in the example of FIG. 3), and for solar cell dies obtained form a wafer having been scribed on a cap layer (such as shown in the example of FIG. 2). In both cases, the open-circuit voltage, $V_{OC}$, was measured with the solar cells still on the wafer (before), and after having been scribed and cleaved from the wafer (after).

TABLE 1

| Scribing directly on window layer | | | Scribing on cap layer | | |
|---|---|---|---|---|---|
| $V_{OC}$ Before | $V_{OC}$ after | Variation (%) | $V_{OC}$ Before | $V_{OC}$ after | Variation (%) |
| 2.530 | 2.495 | −0.5 | 2.496 | 2.496 | 0 |
| 2.520 | 2.495 | −0.3 | 2.501 | 2.497 | −0.1 |
| 2.522 | 2.494 | −0.4 | | | |

As is apparent from TABLE 1, variation in open-circuit voltage is considerably less when scribing is effected through a cap layer. As will be understood by the skilled worker, $V_{OC}$ is directly related to the conversion efficiency of solar cells and to other parameters of solar cells. This is because the Efficiency (Eff), which can also be referred to as conversion efficiency, is related to the open circuit voltage (Voc), the short circuit current (Jsc), the fill factor (FF) and the incident power (generated by the impinging light (sunlight)) coming in ($P_{in}$) as expressed in the equation:

$$Eff = V_{oc} * J_{sc} * FF / P_{in}.$$

As $V_{oc}$ appears to be primarily affected by the defects in the window and p-n junction area, the FF can also decrease due to leakage current caused by damages at the window layer, the p/n junction area, or both. The short-circuit current ($J_{sc}$) is expected to be essentially unaffected by the damages at the window layer and the p-n junction area. $V_{oc}$ is linked to leakage current by the simple relation $$V_{oc} \approx (nKT/e) \ln(J_{sc}/J_{sat})$$

where $J_{sat}$ is the saturation current. A low $J_{sat}$ is desired to increase $V_{oc}$. Higher values of $J_{sat}$ will result from leakage current at the edges of the solar cell.

As such, one can conclude that the formation of scribe lines directly on the window layer 106 can lead to cracks and defects extending to the p-n junction of the solar cell, and cause a decrease in conversion efficiency and of other parameters of the solar cell. That is, a portion of photo-carriers generated in the p-n junction (or in multiple p-n junctions) can diffuse laterally and recombine at the defects formed at the sidewall of the solar cell. That is, such cracks and defects can trap photo-generated carriers and adversely affect the efficiency of the solar cells. Further, such cracks, fractures, and defects give rise to reliability issues as they are apt to propagate moisture, oxidation, and corrosion into the solar cell, which, over time and through temperature variations, can make such solar cells unreliable. This is a particular concern in small area solar cells used in concentrator photovoltaic systems where the ratio of perimeter area to window area (light-input surface area) can be relatively high.

Therefore, it is apparent that by forming the solar cell through a scribe and cleave (with or without stretch) technique, with the scribing step performed on a cap layer, the number on defects at the solar cell sidewalls are reduced and an increase in performance metrics of the solar cell can be observed.

The solar cells sidewalls shown at FIG. 2 and at FIG. 3 were both obtained by scribing and stretching operations, and more defects were observed in the solar cell of FIG. 3, which was scribed on its window layer rather than on a cap layer. As will be understood by the skilled worker, separating solar cells through a sawing of a semiconductor wafer would result in sidewalls of much lesser quality (more defects) than the sidewall shown at FIG. 2.

Therefore, the solar cell of FIG. 1, with its sidewall 112 having a cleaved surface that extends along the height 114 of the cap layer, or along a portion of the height 114, towards the substrate 102, and is parallel to a crystal plane of the solar cell 100 has an improved efficiency over solar cells that do not have such sidewalls.

Figure 4:
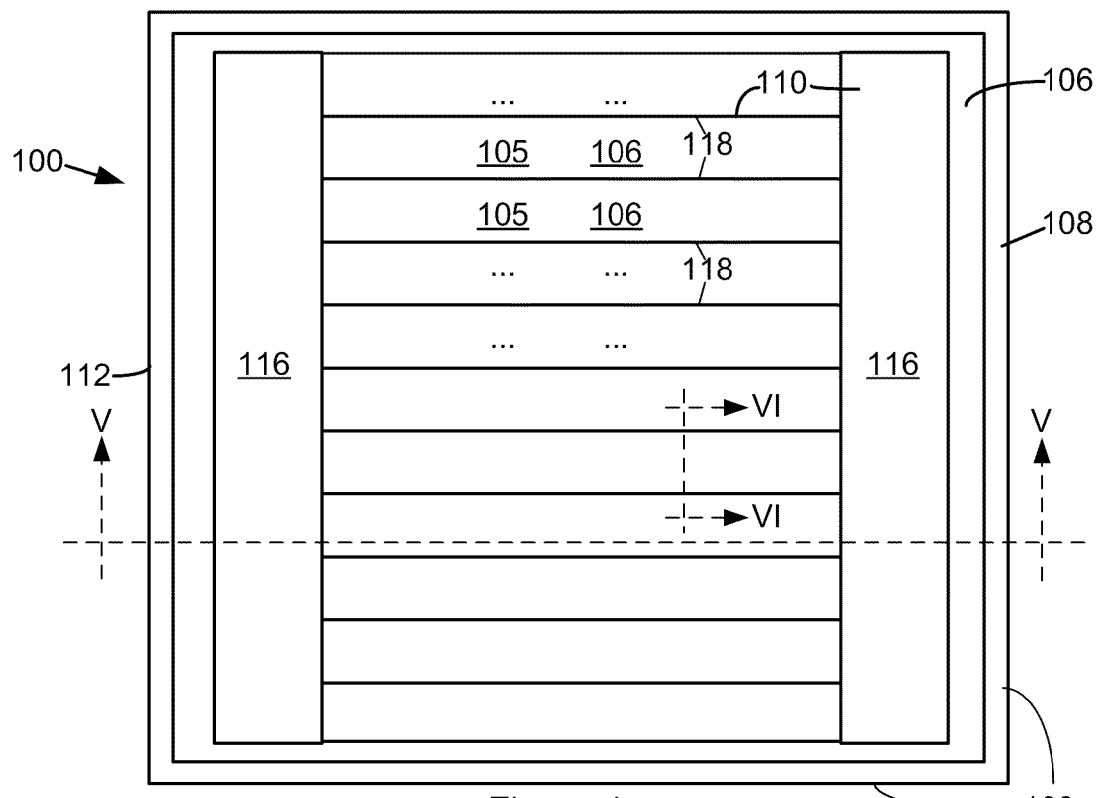
FIG. 4 shows a top view of an exemplary solar cell of the present disclosure.

FIG. 4 shows an exemplary top view of a solar cell 100. At FIG. 4, the cap layer 108 defines a pattern that exposes the window layer 106. In this case, the cap layer 108 can be referred to as a patterned cap layer. The metal layer 110 defines busbars 116 and gridlines 118. The exposed portion of the window layer 106, between the busbars 116 and the gridlines 118 can be referred to as a light-input portion 105. In the present example, the busbars 116 and gridlines 118 are formed atop the cap layer 108. The gridlines 118 are electrically connected to the busbars 116. An external load (not shown) can be connected to busbars 116 through any suitable means such as, for example, wire bonding, welded metal tabs, soldered metal foils or wires, ribbon bonding, etc.

Figure 5:
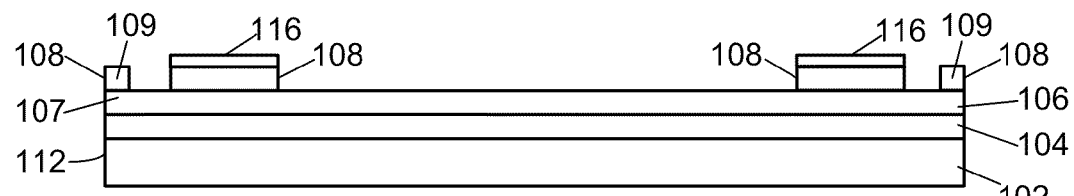
FIG. 5 shows a cross-sectional view of the solar cell of FIG. 4.

FIG. 5 shows a cross-sectional view of the solar cell 100 taken along the line V-V of FIG. 4. As shown at FIG. 4 and FIG. 5, the cap layer 108 layer defines a frame 109 at a perimeter portion 107 of the window layer 106. The perimeter portion 107 lies below the frame 109. Advantageously, the frame 109 provides protection to the window layer 106 and the p-n junction 104 during manipulation of the solar cell 100 though tweezers or any other tool. Further, the frame 109 defines a surface on to which a grab tool, for example, a vacuum pickup tool, can grab and displace the solar cell 100. Although the frame 109 surround the solar cell 100, this need not be the case. Rather, the frame can extend only on a portion of the perimeter portion 107 of the window layer 106 without departing from the scope of the present disclosure.

Figure 6:
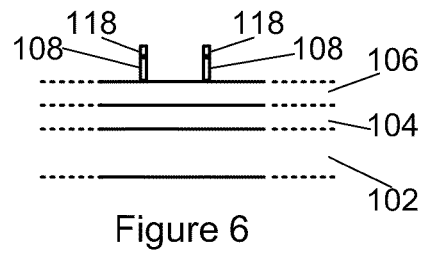
FIG. 6 shows another cross-sectional view of the solar cell of FIG. 4.

FIG. 6 shows a cross-sectional view of the solar cell 100 taken along the line VI-VI of FIG. 4. The gridlines 118 are shown formed on the cap layer 108.

Figure 7:
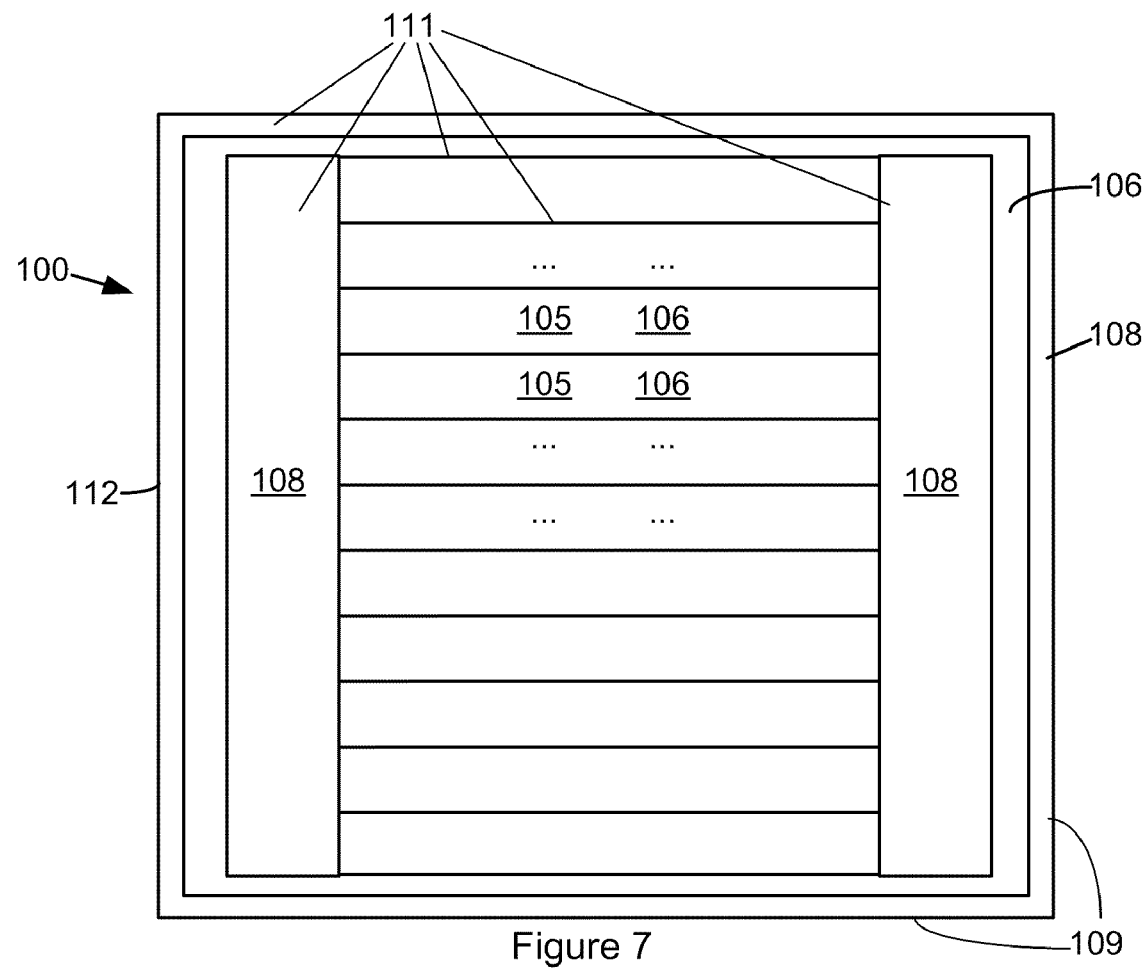
FIG. 7 shows a top view of the solar cell of FIG. 4 prior to having had a metal layer formed thereon.

FIG. 7 shows a top view of the solar cell 100 of FIG. 4 but without the metal layer 110 formed on the cap layer 108. A patterned cap layer 111 and a light-input portion 105 of the window layer 106 are shown.

With reference to FIG. 4 and FIG. 7, as will be understood by the skilled worker, the portion of the solar cell 100 that is to receive sunlight (light-input portion 105), is the portion of the window layer 106 visible through the patterned cap layer 111 and comprised between the busbars 116 and gridlines 118.

Figure 8:
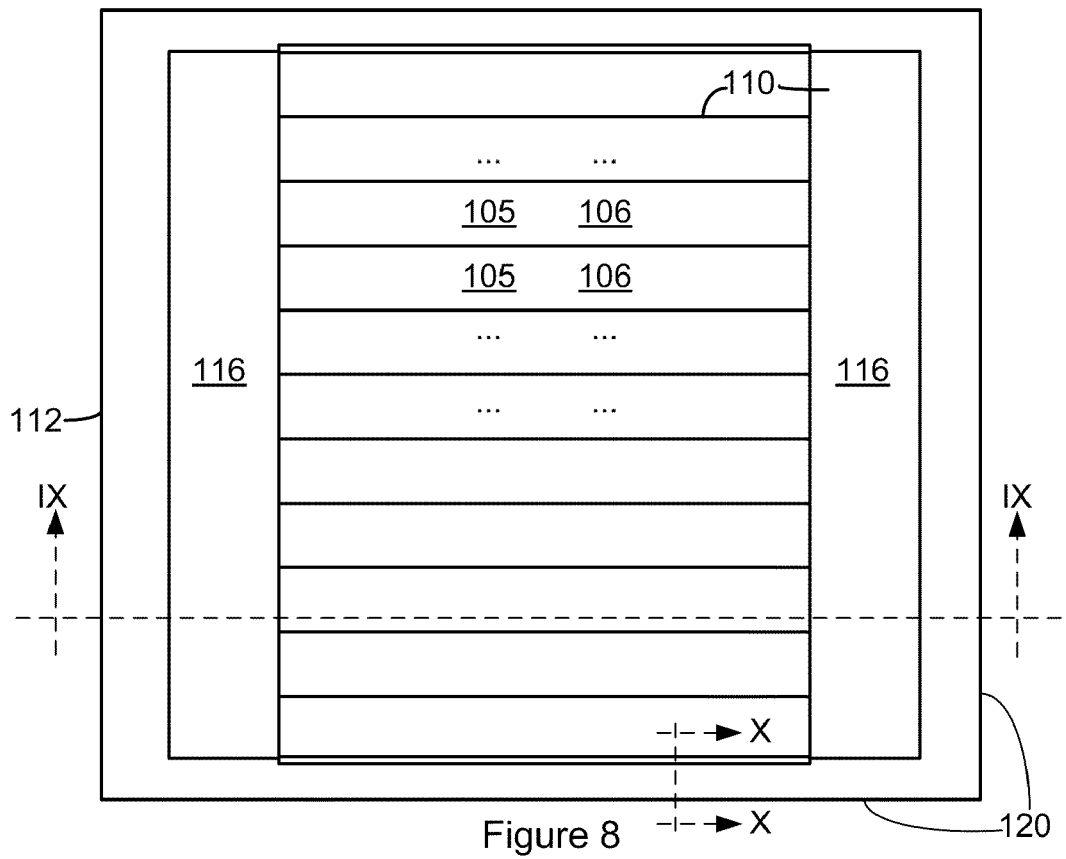
FIG. 8 shows a top view of another exemplary solar cell of the present disclosure.

FIG. 8 shows a top view of another embodiment of a solar cell 100. At FIG. 8, the cap layer 108 defines a pattern that exposes the window layer 106. In this case, as in the embodiment shown at FIG. 4, the cap layer 108 can be referred to as a patterned cap layer. The metal layer 110 defines busbars 116 and gridlines 118. The busbars 116 and gridlines 118 are formed atop the cap layer 108. The gridlines 118 are electrically connected to the busbars 116. An external load (not shown) can be connected to busbars 116 through any suitable means such as wire bonding, welded metal tabs, soldered metal foils or wires, ribbon bonding, etc.

Figure 9:
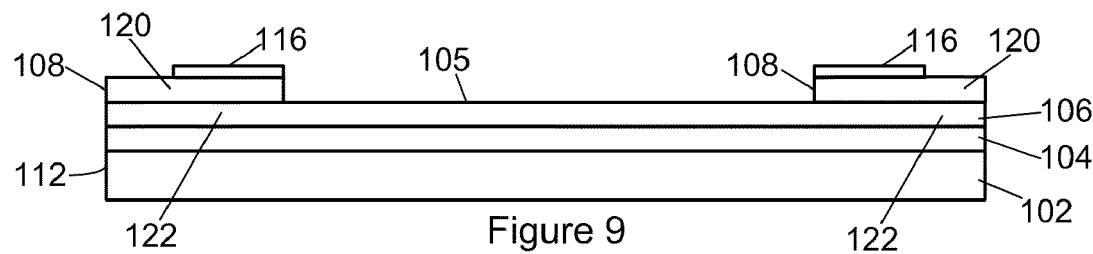
FIG. 9 shows a cross-sectional view of the solar cell of FIG. 8.

FIG. 9 shows a cross-sectional view of the solar cell 100 taken along the line IX-IX of FIG. 8. As shown at FIG. 8 and FIG. 9, the cap layer 108 layer defines a frame 120 at a perimeter portion 122 of the window layer 106. The perimeter portion 122 lies below the frame 120. Advantageously, the frame 120 provides protection to the window layer 106 and the p-n junction 104 during manipulation of the solar cell 100 though tweezers or any other suitable tools. Further, the frame 120 defines a surface on to which a grab tool, for example, a suction tool, can grab the solar cell 100 to displace the solar cell 100. Although the frame 120 surround the solar cell 100, this need not be the case. Rather, the frame can extend only on a portion of the perimeter portion 122 of the window layer 106 without departing from the scope of the present disclosure.

As the frame 120 can be made of a highly-doped semiconductor material, e.g., highly-doped GaAs, and surround the solar cell 100, it can be kept at a constant voltage during electro-plating operations. As will be understood by the skilled worker such electro-plating can be done with the entire cap layer 108 present and with masks covering parts of the cap layer 108 which are to be ultimately free of any metallization. The types of masks discussed here can be photo-resist masks obtained from standard semiconductor photo-lithography techniques, as described below. This electro-plating step, if chosen as a way to metalize the wafer, can be incorporated into the fabrication at the end of the process or earlier into the process.

Figure 10:
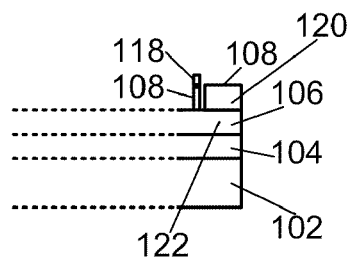
FIG. 10 shows another cross-sectional view of the solar cell of FIG. 8.

FIG. 10 shows a cross-sectional view of the solar cell 100 taken along the line X-X of FIG. 8. The gridlines 118 are shown formed on the cap layer 108. The frame 120 and the perimeter portion 122 of the window layer are also shown at FIG. 10.

Figure 11:
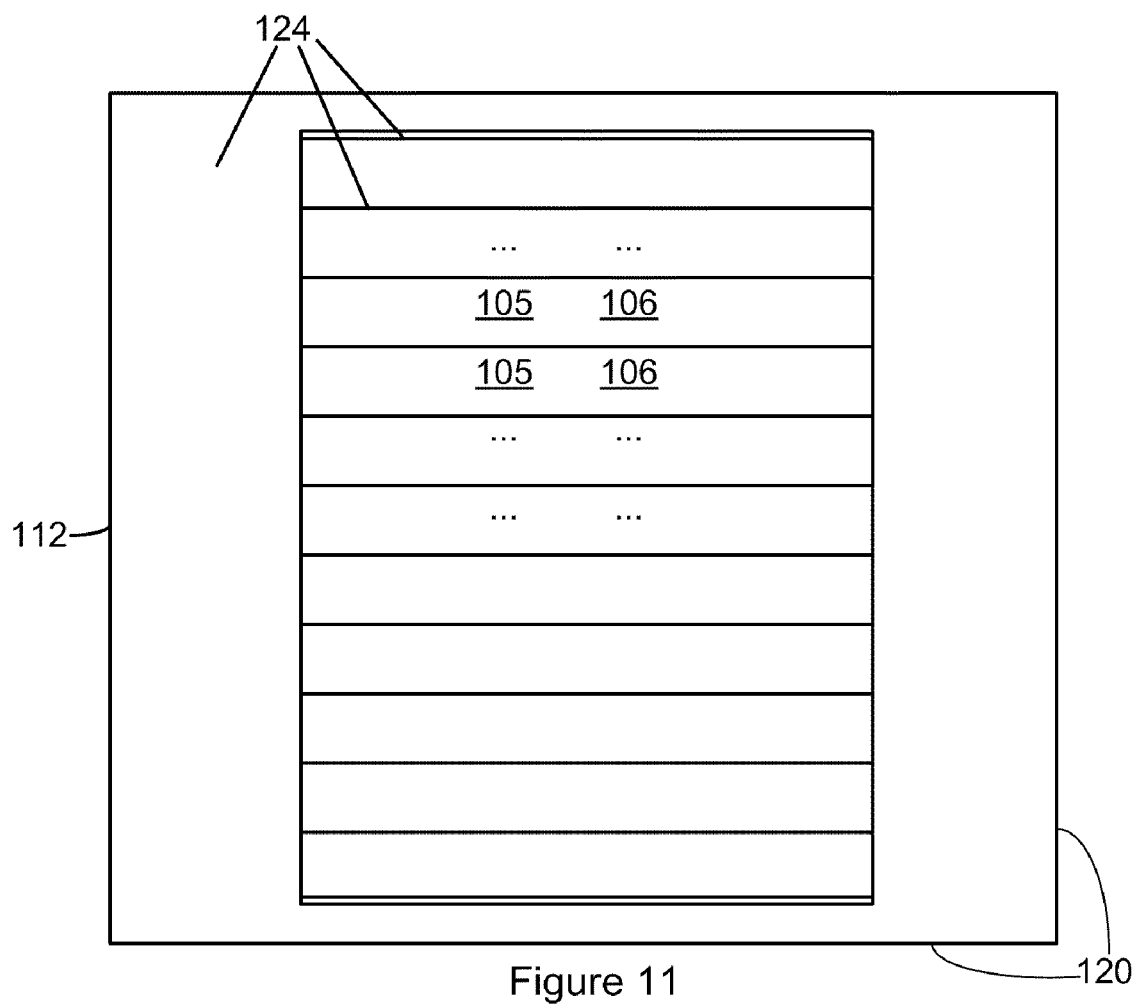
FIG. 11 shows a top view of the solar cell of FIG. 8 prior to having had a metal layer formed thereon.

FIG. 11 shows a top view of the solar cell 100 of FIG. 8 but without the metal layer 110 formed on the cap layer 108. A patterned cap layer 124 and a light-input portion 105 of the window layer 106 are shown.

Figure 12:
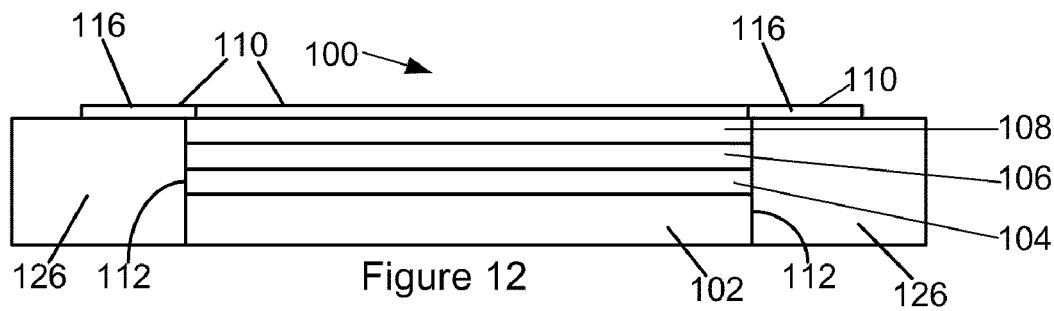
FIG. 12 shows a cross-sectional view of another exemplary solar cell of the present disclosure.

FIG. 12 shows a cross-sectional view of another embodiment of the solar cell 100 of the present disclosure. The solar cell 100 of FIG. 12 has a substrate 102, a p-n junction 104 (or more than one p-n junction), a window layer 106, a cap layer 108, and a metal layer 110. The metal layer forms busbars 116. The solar cell 100 has sidewalls 112 that can the same as the sidewall 112 shown at FIG. 1. Further, the solar cell 100 of FIG. 12 has side pieces 126 adjacent the sidewall 112. The busbars 116 are formed partly on the cap layer 108 and on the side pieces 126. The busbars 116 can be formed mostly atop their respective side piece 126. That is, as shown at FIG. 12, a greater surface area (and volume) of a busbar 116 is formed atop a side piece 126, and a lesser surface area (and volume) of the busbar 116 is formed atop the cap layer 108. In the present embodiment, each busbar 116 bridges the side piece 126 and the cap layer 108. In the present embodiment, and in other embodiments where the busbars 116 are formed mostly atop side pieces, the busbars 116 can be referred to as external busbars.

The side pieces 126 can be formed of electrical insulator material. That is, the side pieces can be electrical insulator pieces. The material used in forming the electrical insulator piece can include at least one of alumina, aluminum Nitride, beryllium oxide, glass, BK7, quartz, sapphire, borosilicate glass, mullite, steatite, forsterite, zirconia, boron nitride, polymers, polyvinyl chloride (PVC), poly-methyl methacrylate (PMMA), and benzocyclobutane (BCB).

Other composites or laminar material such as, for example, FR4 (Flame Retardant 4) material, or other ceramic materials, can also be used to form the side pieces 126. Semi-insulating silicon can also be used to form the side pieces 126.

To understand the advantage of having the busbars 116 formed for the most part, atop their side respective side pieces 126, as shown in the embodiment of FIG. 12, one must consider how a solar cell functions when the busbars 116 are formed atop the substrate 102 and overlying a p-n junction 104, a window layer 106, and a cap layer 108, as shown at FIG. 1. Upon illumination of the solar cell, a voltage develops between the busbars 116 and the substrate side contact of the solar cell. In the case where the substrate is n-doped, and the p-n junction 104 has its p-side closer to the substrate 102 than its n-side, light-absorption of the solar cell in normal operation will cause electrons to move to the top contact, which includes the busbars 116, and holes to move to the bottom contact, which includes the substrate 102. This accumulation of electrons and holes creates a photo-voltage between the busbars 116 and the substrate side contact (bottom contact). The photo-voltage will in turn generate a component of dark current under the busbars 116. The dark current in a solar cell must be kept to a minimum since it affects the solar cell's performance through its $V_{oc}$ according to the relation $V_{oc} \sim \ln(I_{ill}/I_d)$ where $I_{ill}$ is the current under illumination and $I_d$ is the dark current. Moreover, the dark current in the solar cell layers directly under the busbars 116 will increase significantly as the voltage increases under high concentration making it more susceptible to electrostatic discharge failure or to breakdown failure modes caused by local epitaxy or fabrication defects, or from unintentional applied voltage excursions during installation or operation. For example, in normal operation, the density of current is highest in the vicinity of the busbars 116 because all the current from the active area is typically extracted via the busbars 116. The high-current density can lead to local heating in the busbar areas. Such thermal effects around the busbar areas will decrease the semiconductor bandgap of the semiconductor material under the busbars 116. This effect can increase the current flowing under the busbar, especially under high solar concentration, which can lead to an amplified feedback cycle possibly leading to a catastrophic failure of the material in the busbar region (excess currents and excess temperature increases). This is avoided if the busbars 116 are formed for the most part atop their respective side pieces 126.

As such, an advantage of having the busbars 116 formed for the most part atop their respective side pieces 126, is that the dark current is minimized. Furthermore, photo-generated carriers, that is, the electrons and holes created by absorption of light in the solar cell 100, will not diffuse substantially under the busbars 116 and, in turn, be lost in the dark current region of the cell.

Figure 13:
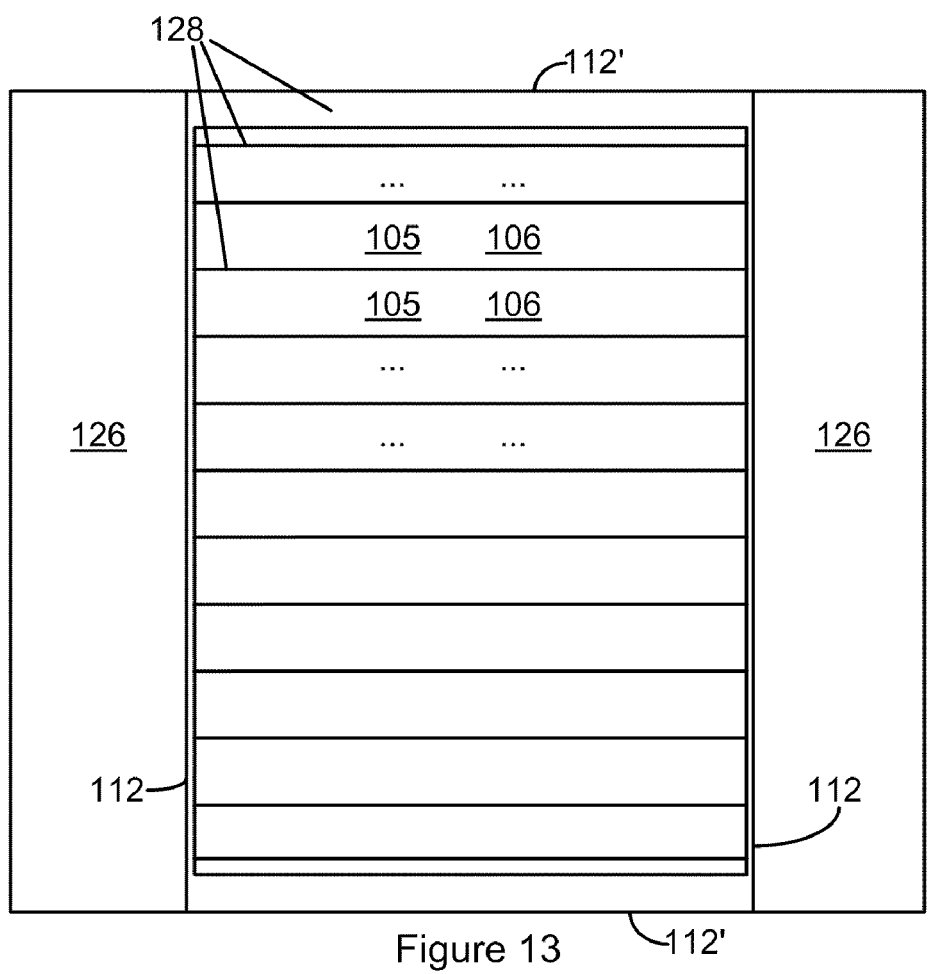
FIG. 13 shows a top view of the solar cell of FIG. 12.

FIG. 13 shows an exemplary top view of the solar cell 100 of FIG. 12, without the metal layer 110. A patterned cap layer 128 and a light-input portion 105 of the window layer 106 are shown. As shown at FIG. 13, sidewalls 112', which can be similar to the sidewalls 112 and which do not have side pieces facing them, are also present.

Figure 14:
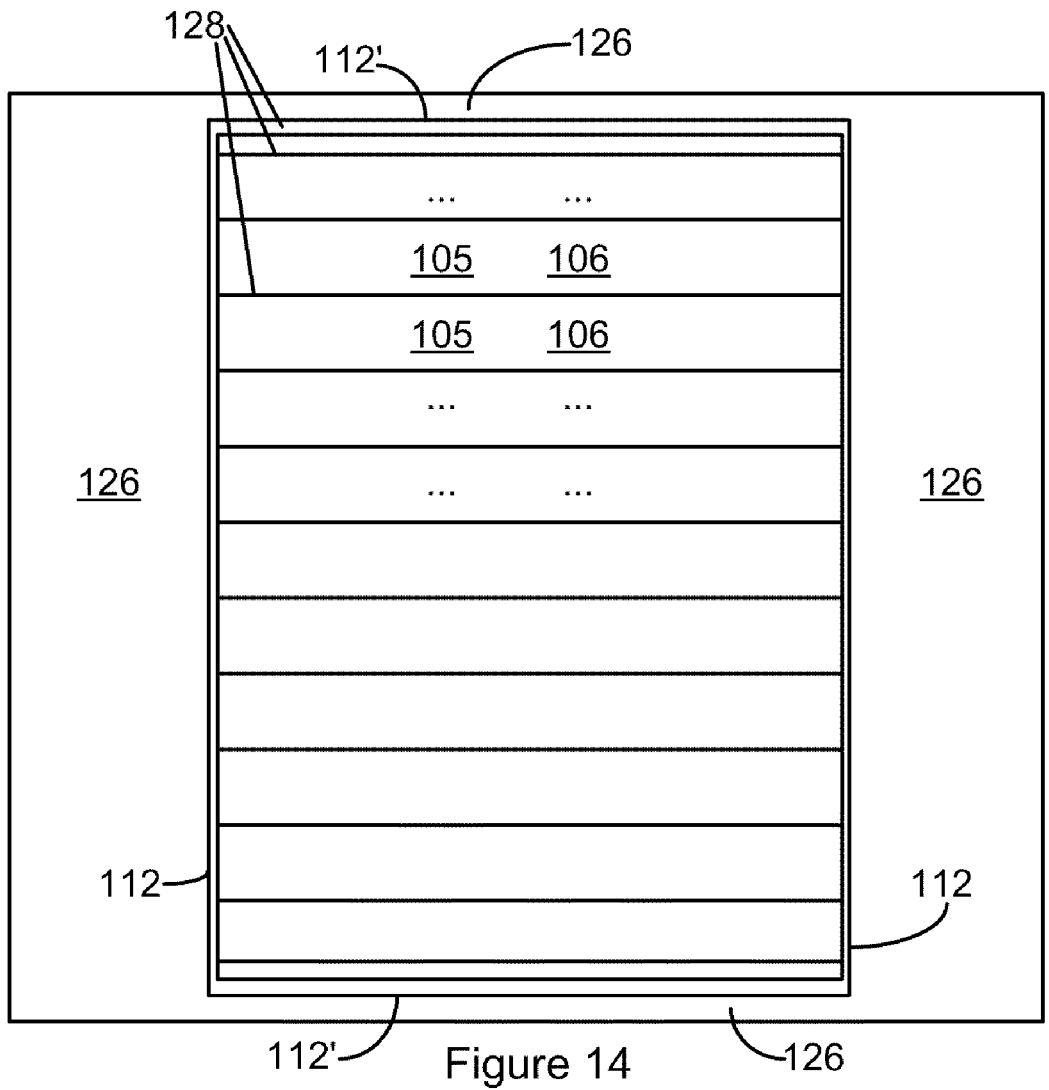
FIG. 14 shows a top view of yet another exemplary solar cell of the present disclosure.

FIG. 14 shows another exemplary top view of the solar cell 100 of FIG. 12, without the metal layer 110. As shown in the embodiment of FIG. 14, the sidewalls 112' do have side pieces facing them. In the present embodiment, the side pieces 126 surround the patterned cap layer 128. An example of how the side pieces 126 can be formed will be described further below.

Figure 15:
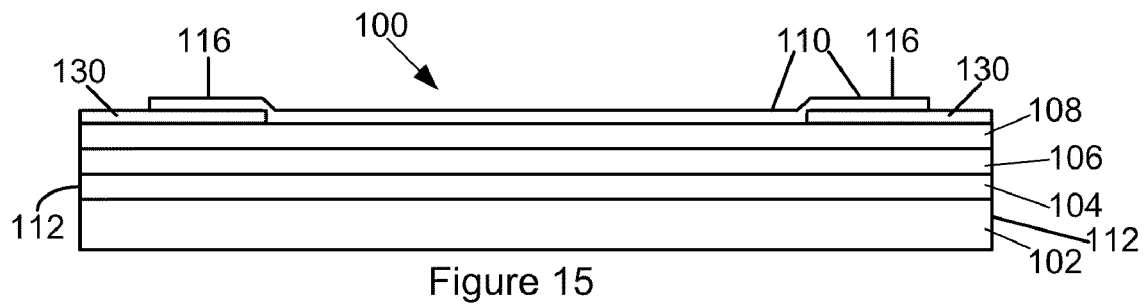
FIG. 15 shows a cross-sectional view on another exemplary solar cell of the present disclosure.

FIG. 15 shows a cross-sectional view of another embodiment of the solar cell 100 of the present disclosure. The solar cell 100 of FIG. 15 has a substrate 102, a p-n junction 104 (or more than one p-n junction), a window layer 106, a cap layer 108, an electrical insulator layer 130, and a metal layer 110. The metal layer 110 forms the busbars 116, which are, for the most part, formed atop the electrical insulator layer 130. That is, a greater surface area (and volume) of a busbar 116 is formed atop the electrical insulator layer 130, and a lesser surface area (and volume), if any, of the busbar 116 is formed atop the cap layer 108. The solar cell 100 of FIG. 15 has the same advantages as the solar cell of FIG. 12. Advantages of the solar cell design of FIG. 15 include reduced dark current under the busbars 116 and reduced risks of current/voltage breakdown under the busbars 116 due to defects from epitaxy, fabrication or voltage excursion in assembly or operation as described above in relation to FIG. 12.

Figure 16:
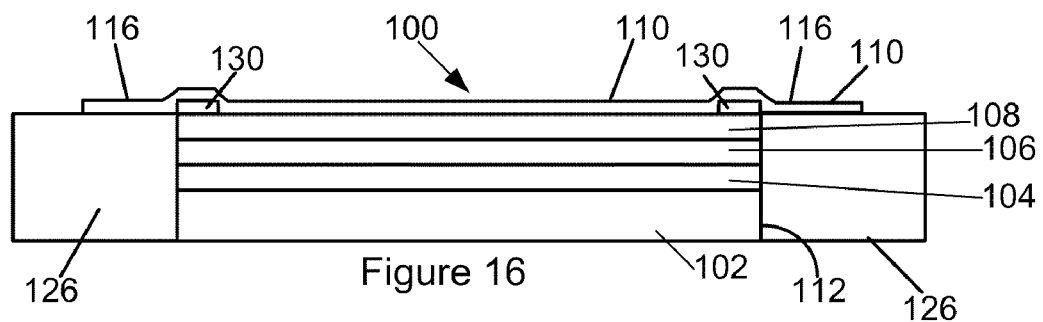
FIG. 16 shows a cross-sectional view on another exemplary solar cell of the present disclosure.

FIG. 16 shows a cross-sectional view of another embodiment of the solar cell 100 of the present disclosure. The solar cell 100 of FIG. 16 has a substrate 102, a p-n junction 104, a window layer 106, a cap layer 108, an electrical insulator layer 130, and a metal layer 110. As in the solar cell of FIG. 12, the solar cell of FIG. 16 has sidewalls 112 adjacent side pieces 126. The electrical insulator layer 130 is formed atop a portion of the cap layer 108. The metal layer 110 forms busbars 116, which are, for the most part, formed atop side pieces 126 and the electrical insulator layer 130. The solar cell 100 of FIG. 16 has the same advantages as the solar cell of FIG. 12. The embodiment of FIG. 16, which also has low dark current under the busbars 116, can be considered a hybrid of the embodiments of FIG. 12 and of FIG. 15. Although not shown at FIG. 16, the insulator layer 130 may extend atop the side piece 126 without departing from the scope of the present disclosure. In such an embodiment, the insulator layer 130 may add mechanical/structural strength to the solar cell 100 by acting as a bond between the cap layer 108 and the side-piece 126. Further, the busbars 116 may bridge the cap layer 108 and the side pieces 126, and overly the insulator layer 130, without departing from the scope of the present disclosure. The insulator layer 130 can also be formed on the sidewall 112 without departing from the scope of the present disclosure.

Figure 17:
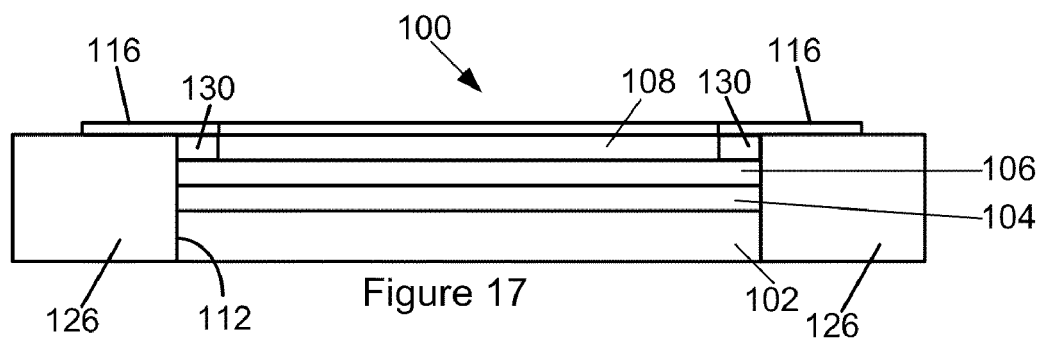
FIG. 17 shows a cross-sectional view on another exemplary solar cell of the present disclosure.

FIG. 17 shows a cross-sectional view of another embodiment of the solar cell 100 of the present disclosure. The solar cell 100 of FIG. 17 has a substrate 102, a p-n junction 104, a window layer 106, a cap layer 108, an electrical insulator layer 130, and a metal layer 110. As in the solar cell of FIG. 12, the solar cell of FIG. 17 has sidewalls 112 adjacent side pieces 126. The electrical insulator layer 130 is formed atop a portion of the window layer 106 and adjacent the cap layer 108. The metal layer 110 forms busbars 116, which are, for the most part, formed atop side pieces 126 and the electrical insulator layer 130. Further, the busbars 116 bridge the cap layer 108 and the side pieces 126. The solar cell 100 of FIG. 17 has the same advantages as the solar cell of FIG. 12 in that it has low dark current under the busbars 116. Alternatively, the insulator layer 130 can also be formed on the sidewall 112 without departing from the scope of the present disclosure.

As will be appreciated by the skilled worker, the embodiment of FIGS. 12, 13, 14, 16 and 17 mostly removes the busbars 116 from the epitaxially-grown layers (material) of the solar cells, thus providing more surface area of the semiconductor from which the solar cells are formed to convert light into electricity. Exemplary embodiments have been shown above, but other variations can be designed without departing from the scope of the disclosure. Alternatively, the embodiments of FIGS. 12, 13, 14, 16 and 17 can be used to generate a same amount of power with less epitaxially-grown semiconductor material, which is expensive. This can also increase the density of devices per wafer in manufacturing, i.e., the wafer utilization efficiency is increased. Since a typical busbar is between 0.1 mm to 0.5 mm wide and there are typically two bus bars per device, it could increase the available area by up to 10% for ~1×1 cm$^2$ cells and up to 100% for 1×1 mm$^2$ cells. The side pieces 126 can be secured to the sidewall 112 or sidewall 112' using, for example, adhesive materials or solutions. The sidewalls 112 shown at FIGS. 12, 13, 14, 16, and 17, and the sidewalls 112' shown at FIG. 14 can be formed by a scribe and cleave technique as described elsewhere in the present disclosure or, can be formed by a sawing process if defects created by sawing are not expected to cause a noticeable decrease in performance metrics.

Figure 18:
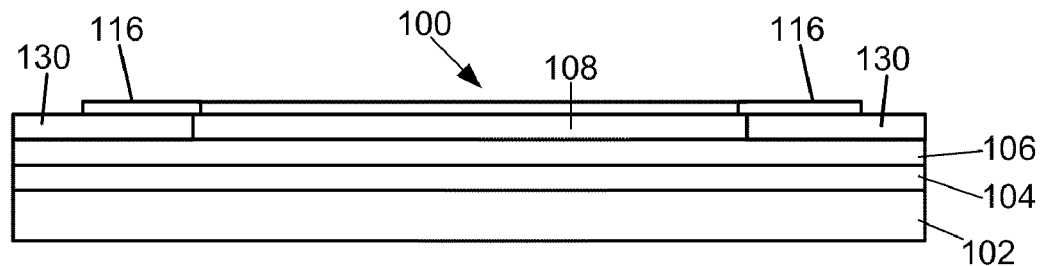
FIG. 18 shows a cross-sectional view on another exemplary solar cell of the present disclosure.

FIG. 18 shows a cross-sectional view of another embodiment of the solar cell 100 of the present disclosure. The solar cell 100 of FIG. 18 has a substrate 102, a p-n junction 104 (or more than one p-n junction), a window layer 106, a cap layer 108, an electrical insulator layer 130, and a metal layer 110. The electrical insulator layer 130 is formed atop a portion of the window layer 106 and adjacent the cap layer 108. The metal layer 110 forms busbars 116, which are, for the most part, formed atop the electrical insulator layer 130. That is, a greater surface area (and volume) of a busbar 116 is formed atop the electrical insulator layer 130, and a lesser surface area (and volume), if any, of the busbar 116 is formed atop the cap layer 108. The solar cell 100 of FIG. 18 has the same advantages as the solar cell of FIG. 12 in that it has low dark current under the busbars 116. The combination of reduced dark current under the busbars 116, which will increase the performance metrics of the solar cell 100, and the reduced risk of locally short-circuiting the p-n junction 104 via defects, or in the event of bandgap reduction via thermal effects in the busbar areas, are particularly beneficial in that improved solar cell performance metrics and improved reliability can be obtained.

Figure 19:
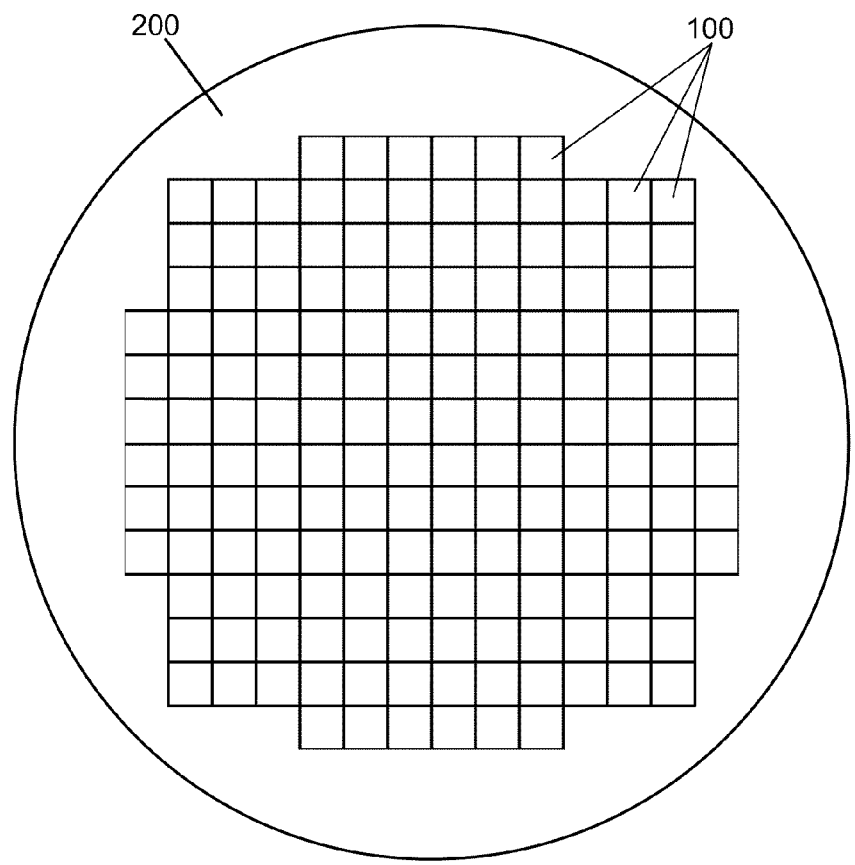
FIG. 19 shows a top view of a semiconductor wafer having formed thereon a plurality of solar cell patterns.
Figure 20:
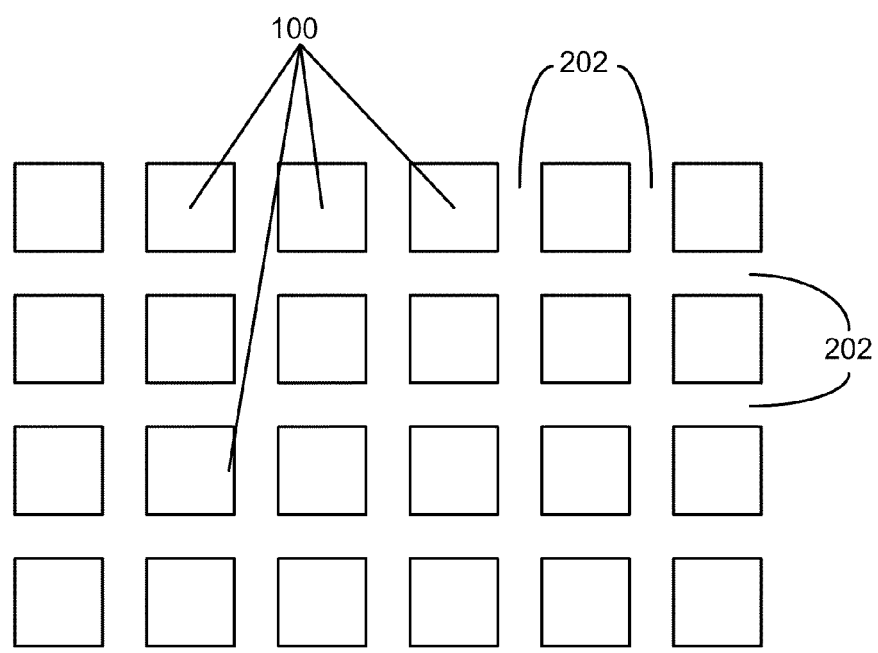
FIG. 20 shows a close-up view of the semiconductor wafer of FIG. 19.

FIG. 19 shows a top view of a wafer 200 having formed thereon a series of solar cells 100. FIG. 20 shows a close up view of FIG. 19. FIG. 20 shows a group of 24 solar cell 100. As shown in this close up view of FIG. 20, each solar cell is spaced-apart from other solar cells by scribe lanes 202, which can also be referred to as cutting lanes. It is along the scribe lanes 202 that the wafer 200 can be scribed and cleaved.

In III-V semiconductor wafers, the growth surface of the wafer 200 can be aligned in any suitable crystallographic orientation. One such alignment direction is the [001] direction. In wafers with surfaces aligned in the [001] direction, it is possible to scribe the wafer 200 along any plane of the (110) family of planes, which have fewer bonds per unit area compared to the other crystal planes, that is, the (110) family of planes are good cleaving planes for III-V crystals (wafers). Scribing along such planes results in solar cell dies that can be separated from each other relatively easily. It can therefore be advantageous to have the scribe lanes 202 aligned along planes of the (110) family of planes. Further, the wafer 200 can be a vicinal wafer (vicinal substrate), having its alignment direction titled, by a few degrees, for example a vicinal angle (or off-cut angle, or mis-orientation angle) ranging from 0° to 20°, in any direction, for example tilted towards one of the [111] plane.

Figure 21:
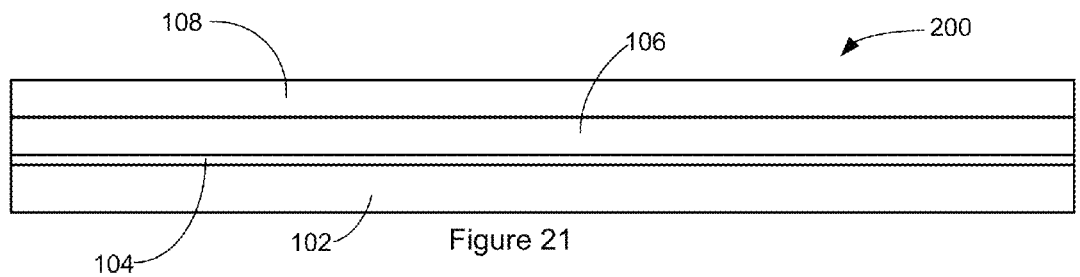
FIG. 21 shows a cross-sectional view of a semiconductor wafer of the present disclosure.

FIG. 21 shows a side cross-sectional view of the exemplary wafer 200 used in manufacturing solar cells. The wafer 200 has a substrate 102, a III-V heterostructure (or any other type of semiconductor heterostructure) having a p-n junction 104 (or more than one p-n junction), a window layer 106, and a cap layer 108, which can also be called a solar cell cap layer or a contact layer, formed on the window layer 106. The various layers 104, 106 and 108 can be formed on (atop) the substrate 102 by any suitable epitaxial growth method such as by molecular beam epitaxy (MBE), metal organic chemical vapor deposition (MOCVD), chemical beam epitaxy (CBE) etc. As will be understood by the skilled worker, the window layer 106 needs to be exposed in order to allow sunlight to reach the p-n junction 104 in order to generate photo-carriers in the solar cell 100. Different approaches can be used to expose the window layer 106 and in forming a metallization layer (also referred to as a metal layer) on the cap layer 108. Exposing the window layer 106 typically involves forming a pattern in the cap layer 108 to obtain a patterned cap layer that has openings to the window layer 106.

Such approaches typically include the use of well-known semiconductor photo-lithography techniques. In these techniques, sacrificial photo-resist (PR) layers are spun on the wafer, exposed to light under one or more masks, and etched to obtain a pre-determined pattern for subsequent etching of the cap layer 108 in pre-determined areas (for example by wet chemical etching or dry etching). Forming a metal layer (metallization layer) can be achieved through metal deposition. As an example of formation a metal layer, a first layer of PR is formed on a wafer and subsequently exposed to light, which can be, for example, ultraviolet light or short wavelength visible light, X-ray light. Positive PR, negative PR, bi-layer lift-off PR or by combinations thereof, can be used as appropriate. Subsequently, the PR can be removed in the areas where the metal pattern is desired. The PR can also be exposed to electron beam radiation, to open areas where metal is desired. The metal is then deposited (e.g., by thermal evaporation, sputtering, electro-plating, or by combinations thereof). The rest of the PR can then be removed along with unwanted metal (this technique can be referred to as a lift-off technique in the case where metal evaporation is used). The metal deposited on the wafer (the remaining metal) can then be used as a mask to etch the cap layer 108 in areas where no metal was deposited (this is a technique that is sometimes referred to as a "self-alignment" technique). In this case, one requires a high selectivity of the etchant to etch the cap layer material and not the metal nor the underlying layers such as the window layer. Etchants can be either wet chemicals such as acids and bases or dry as in plasma based etching techniques like RIE (Reactive Ion Etching). The Metal layers can also be deposited using shadow masking techniques which do not require any PR. However, shadow masking techniques typically does not allow for feature sizes as small as those available through PR-based photo-lithography.

Figure 22:
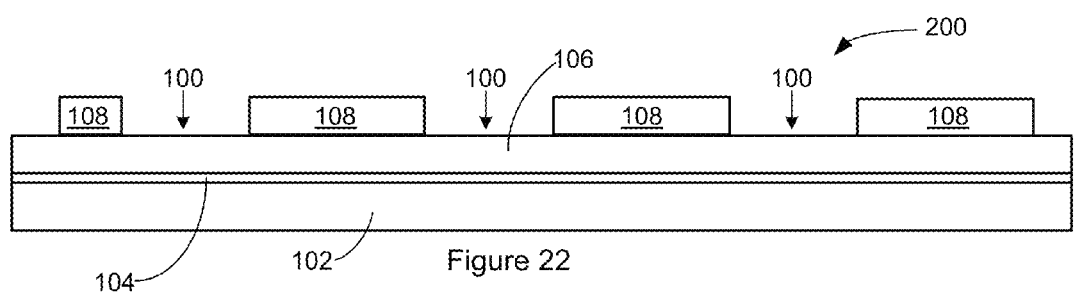
FIG. 22 shows a cross-sectional view of the semiconductor wafer of FIG. 21 having undergone processing steps.
Figure 23:
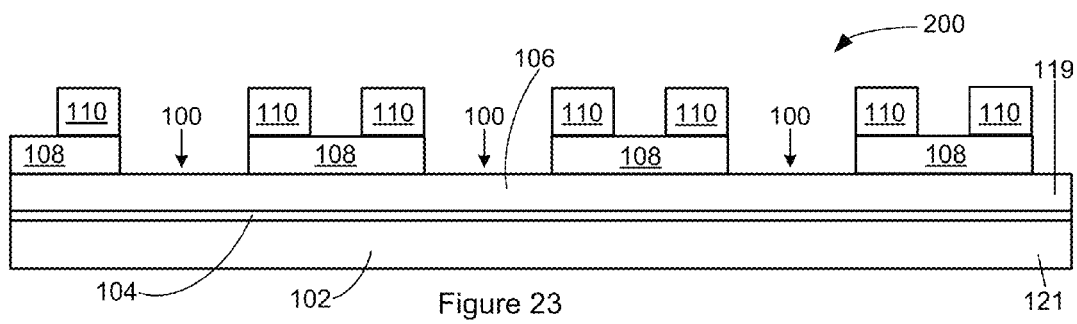
FIG. 23 shows a cross-sectional view of the semiconductor wafer of FIG. 22 having undergone subsequent processing steps.

FIG. 22 shows a cross-sectional view of the wafer 200 having been processed to expose the window layer 106 in a pattern that defines solar cells 100. FIG. 23 shows the wafer 100 having had a metal layer 110 formed on remaining parts of the cap layer 108 on the window side 119 of the wafer 200. The metal can include any suitable material that will provide an appropriate contact (e.g., an ohmic contact) to the semiconductor cap material. These metals are deposited, or otherwise formed, as one or several layers on the semiconductor and can possibly be annealed at higher temperatures in another step to improve conductivity and adhesion of the contacts. Such contacts are generally referred to as ohmic contacts and can be made of various alloys, notably a Ni-based alloy such as Ni/AuGe/Ni and Ge/Ag/Ni or a Au-based alloys such as Pd—Ge—Ti—Pt—Au for an n-type GaAs cap layer.

Transparent conductive film (TCF), organic or inorganic in nature, or a transparent conductive oxide (TCO) such as Tin doped Indium Oxide (ITO), or aluminum doped zinc oxide (AZO), indium doped cadmium oxide or other wide-bandgap semiconductor oxides, can also be used as the top contact by itself or combined with the metal and cap layers. That is, it is possible to use a conductive and transparent electrode by itself or combined with metal conductor lines as part of the top contact.

As will be understood by the skilled worker, another electrical contact is required to be made to the substrate-side 121 of the p-n junction 104 in order to have functional solar cells 100. Such a contact can be formed in any suitable way before or after the wafer 200 has been separated into solar cell dies, also referred to simply as dies. Unless a special technology is used for the back contact (for example, making the back contact though etched vias), a continuous metal film forming effectively a simple blanket coverage of a large portion or the entirety of the backside of each solar cell die is required, with typically no need for photo-lithography. However, photolithography can be used to define a grid for the back contact, similarly to the front contact. Different materials are usually required for the back contact since the polarity of the contact is inverted compared to the top contact. For example, if the top contact is an n-type semiconductor the bottom contact will typically be on a p-type semiconductor and vice-versa. Alternatively, if the polarity has been inverted through the stack of semiconductor layers, for example, by using a tunnel junction, then the top and bottom contact can have the same polarity. Typical contacts for such p-type semiconductors include Pt/Ti and Au/Zn/Au covered Ag, Au or both. As mentioned previously the contacts for n-type semiconductors typically consists of Ni/Au/Ge/Ni, Ni/AuGe/Ni and Ge/Ag/Ni or Au based such as Pd—Ge—Ti—Pt—Au, or any other metal contact that can form an ohmic junction with the substrate. For example, in the case when the substrate consists essentially of bulk p-type germanium, then indium or aluminum can also be used as the back contact.

Figure 24:
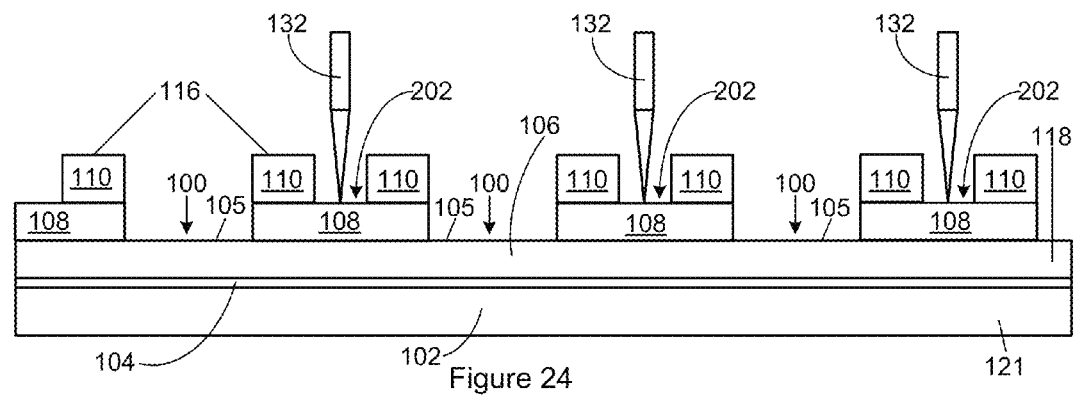
FIG. 24 shows a cross-sectional view of the semiconductor wafer of FIG. 23 being subjected to scribing.

FIG. 24 shows a cross-sectional view of the wafer 200 undergoing a scribing step of a scribe and cleave (stretch) process. A scribing tool 132 is shown scribing lines on the wafer 200, on the cap layer 108, along cleaving lanes (cutting lanes) 202. Subsequent the formation of the scribed lines, the solar cells 100 are separated from each other through a suitable application of force at, or adjacent the scribed lines. As shown above, at FIG. 2 and FIG. 3, the formation of scribed lines on the cap layer 108 limits the damage to the p-n junction 104 whereas scribing directly on the window layer 106 can lead to cracks, fractures, and defects extending to the p-n junction 104, which can cause a decrease in conversion efficiency and of other performance metrics and parameters of the solar cells 100. As stated above, such cracks and defects give rise to reliability issues as they are apt to propagate moisture and corrosion into the p-n junction 104, which, over time and through temperature variations, can make the solar cell unreliable. As seen at FIG. 24, each solar cell 100 has a pair of busbars 116 (metallization pads). The busbars 116 are electrically connected to each other though gridlines (not shown) and form the window side 119 contact of a given solar cell 100. The cross-sectional view of FIG. 24 is akin to that of FIG. 9 in that no cap layer material and gridlines are shown between pairs of busbars 116, atop the light-input portion 105 of the window layer 106.

Figure 25:
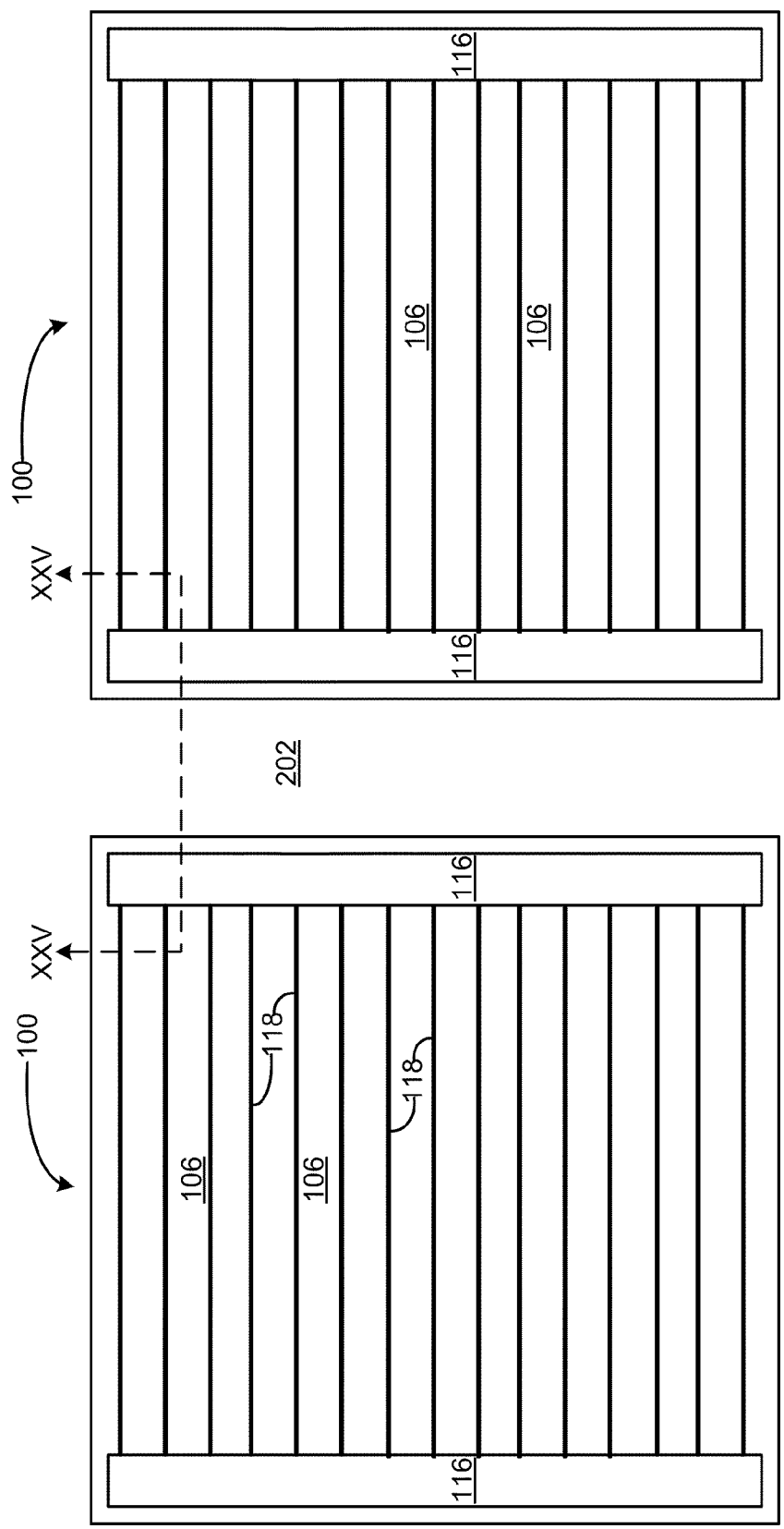
FIG. 25 shows a top view of a pair of side by side solar cells, prior to being separated.

FIG. 25 shows a pair of exemplary solar cells 100 side by side on the wafer 100. Each solar cell 100 has a pair of busbars 116 electrically connected to each other through gridlines 118, which can also be called connector lines. The gridlines 118 help carry the photocurrent generated by the underlying p-n junction 104 to the busbars 116. As for the busbars 116, the gridlines 118 are formed with the metal layer 110 on top of the cap layer 108 (as in FIG. 24). The window layer 106 is exposed between pairs of connector lines 118. The two solar cells 100 of FIG. 25 are separated by a scribe lane 202.

Figure 26:
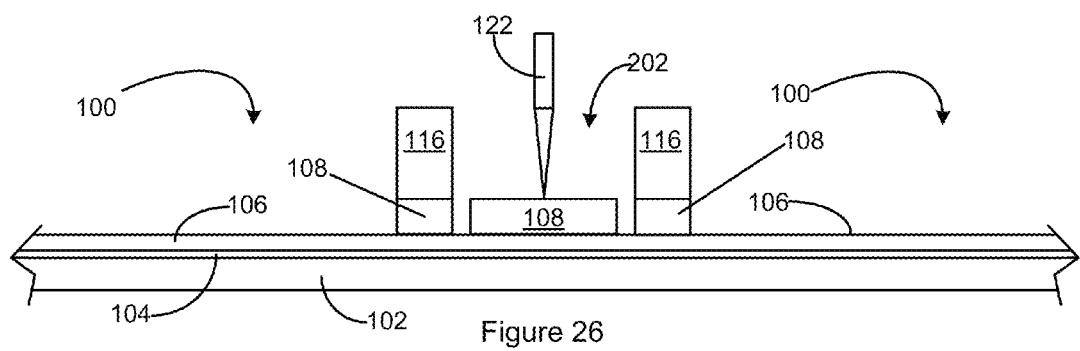
FIG. 26 shows a cross-sectional view of the pair of side by side solar cells of FIG. 25 being subjected to scribing.

FIG. 26 shows a cross-sectional view taken along the line XXV-XXV of FIG. 25. As shown at FIG. 26, material from the cap layer 108 is left in the scribe lane 202. As shown by the scribing tool 122 present in the cutting lane between the pair of busbars 116, it is on this material, cap layer material in the scribe lane 202 that the scribing step of the scribe and cleave process is effected. Once separated from each other, each solar cell can have the appearance shown at FIGS. 4-6, which are described above. The scribing tool can be a diamond tool with its crystal plane configuration arranged to scribe the semiconductor surface appropriately. Alternatively, scribing can be effectively done in the cap layer using a laser with the appropriate wavelength and pulse duration and duty factor (for example femto-seconds or pico-seconds short wavelength pulsed lasers). If laser dicing is used, it will also be advantageous to use the cap layer as described herein since the laser cutting can also affect negatively the side wall quality or even melt some of the semiconductors on the sidewall and that would reduce the performance of the device. Ion beams and/or dry or wet etch techniques can also be used or combined in the scribe and cleave process. Also, a roll or an impact bar can be used to apply some pressure near, below, or above the scribe lane, to assist the cleaving process in any of the approach described above.

Alternatively, the solar cell 100 can be manufactured by removing the cap layer material altogether from the scribe lanes 202 and a different type of material can be grown in the scribe lanes 202. For example, gallium nitride (GaN), which is a very hard semiconductor crystal, could be epitaxially grown in the scribe lanes 202, as could any other semiconductor alloy that has substantially the same lattice constant as the rest of the layer in the solar cell 100. The scribing step could then be effected on GaN. This could possibly lead to even less cracks and defects extending down to the p-n junction 104 and to the p-n junctions formed therein. The thickness of the cap layer 108 can range, from 0.001 micron to 10 micron, or, more typically, from 0.2 to 1 micron. A thinner cap layer is desirable from a fabrication point of view to minimize undercuts (i.e., the lateral etch under the patterned cap layer) especially in wet etching and to reduce processing time. Too thin a layer on the other hand can result in spiking or shorting by metal diffusing through the cap which is a known possible problem with Ni-based contacts (i.e., diffusion of dopants going too deep in local areas of the metal contact).

As will be understood by the skilled worker, the exposed portion of the window layer 106, i.e., a portion having had cap layer material removed therefrom (the light-input portion 105) can be covered by an antireflection coating made of any suitable material such as, for example, $TiO_2$, $Al_2O_3$, $SiO_2$, $Sb_2O_5$, $Ta_2O_5$, $SiN_x$, $MgF_2$, ZnSe, ZnS, zirconium oxide, zirconium dioxide or Indium-Tin-Oxide layers, or any other suitable combination of two or more of these layers, or similar dielectric layers, typically chosen with a combination of index of refraction that tend to minimize the reflections over the wavelength range of interest by essentially providing progressive steps in the index of refraction when going from the solar cell window to the surrounding medium which is typically air, an encapsulant medium, concentrating optics or a combination of the above used to focus the sunlight and further protect the solar cell 100. A bi-layer combining a low index of refraction and a high index refraction from a choice of the above dielectric typically provides good anti-reflective properties as would be known by a skilled worker. For example one of the following bi-layer are preferably used $TiO_2/Al_2O_3$, $SiO_2/Sb_2O_5$, $SiO_2/Ta_2O_5$, $Al_2O_3/Sb_2O_5$, $SiO_2/SiN_x$, $MgF_2/ZnSe$, $Al_2O_3/Ta_2O_5$, $MgF_2/ZnS$, $SiO_2/TiO_2$, Indium-Tin-Oxide layers combined with some of the above dielectrics.

Figure 27:
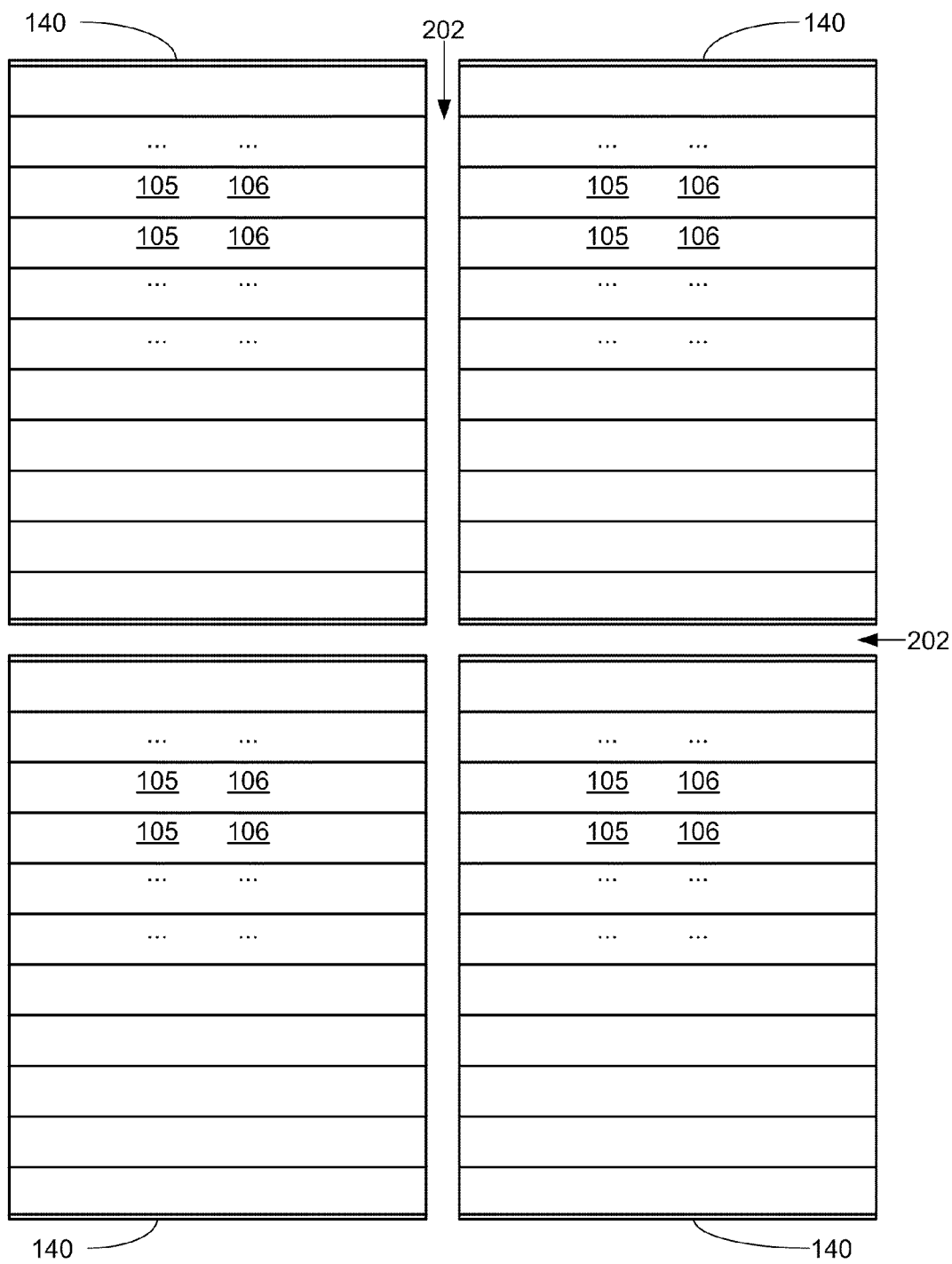
FIG. 27 shows a top view of four side by side solar cell structures prior to being separated form one another.

FIG. 27 shows four solar cell structures 140 formed on a wafer 200. Each structure 140 is separated from the other structures 140 by scribe lanes 202. The top surface of the scribe lane includes the cap layer 108 (as shown in FIG. 26 for example). Once separated from each other, the structures 140 can be used to form solar cells using side pieces 126 or external busbars such as shown in the embodiment of FIG. 12, which is described above.

In exemplary embodiments discussed above, III-V compounds can be used. Alternatively, II-VI semiconductor alloys can be used by themselves or combined with III-V alloys or with other semiconductor alloys as appropriate. The semiconductor materials can combine single crystal alloys, polycrystalline alloys, or partially amorphous materials. The heterostructures to be processed in accordance with the present disclosure include window layers, emitter layers, base layers, back surface field layers, tunnel junctions, p-n junctions, p-i-n junctions, buffer layers, metamorphic transition layers, etc. The substrate 102 can be made of any compound semiconductor such as, for example, GaAs, InP, GaP, InAs, InSb or any other crystalline material upon which compound semiconductor material that can form solar cell can be grown. Such crystalline materials can include, e.g., Ge or Si substrates or combinations including SiGe structures. The p-n junction 104 (or several p-n junctions) can include homogeneous or heterogeneous semiconductor materials to form homojunctions, heterojunctions, or heterostructures, including but not restricted to GaAs, InGaAs, GaInP, AlGaInP, AlInP, AlGaAs, N-based III-V alloys, Sb-based III-V alloys, or II-VI compound semiconductors in bulk layers, or possibly also incorporating low-dimensionality structures such as quantum wells, quantum wires, or quantum dots. The window layer can include AlInP, AlGaInP, ZnSe, AlP, or other III-V or II-VI alloys with suitable band gaps and interface properties, such as ZnSe or as described above. The semiconductor materials formed on and above the substrate 102 can be pseudomorphic with the substrate 102. That is, some lattice parameters (e.g., typically the in-plane lattice parameter) of the semiconductor materials formed on and above the substrate 102 is essentially the same as that of the substrate 102. Alternatively, the semiconductor materials formed on and above the substrate 102 can be metamorphic with respect the substrate 102. That is, the lattice parameters of some of the layers formed on and above the substrate may have substantially different lattice parameters and the elastic strain between these layers is partially or totally relaxed, which creates dislocations in the metamorphic solar cells.

Figure 28:
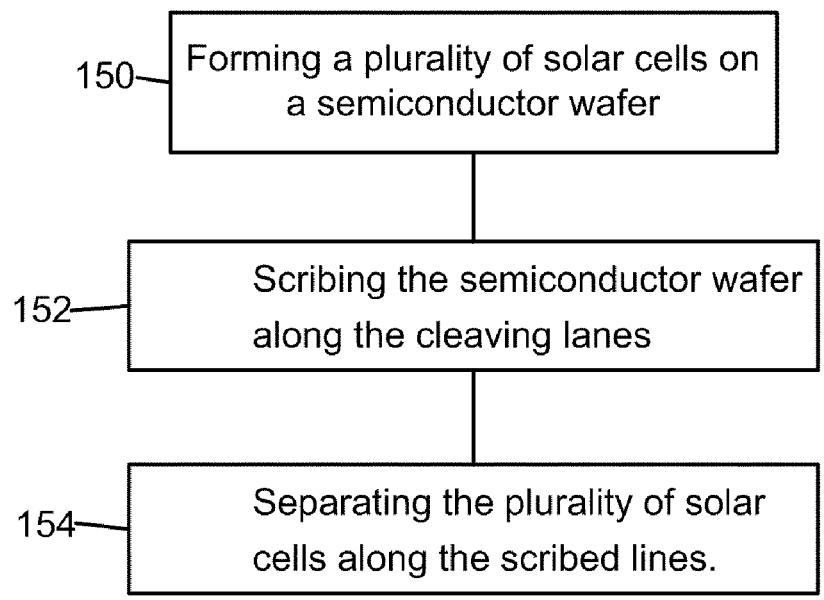
FIG. 28 shows an exemplary method of the present disclosure.

An exemplary method of manufacturing a solar cell is shown as a flow chart at FIG. 28. At a first step 150, a plurality of solar cells is formed on a semiconductor wafer. Each solar cell includes one or more subcells electrically connected in series, each subcell has a p-n junction; a window layer formed atop the one or more subcells; and a cap layer formed on the window layer. At step 152, the semiconductor wafer is scribed along scribe lanes to form scribe lines. Finally, at step 154, the plurality of solar cells are cleaved or otherwise separated from each other along the scribed lines.

Figure 29:
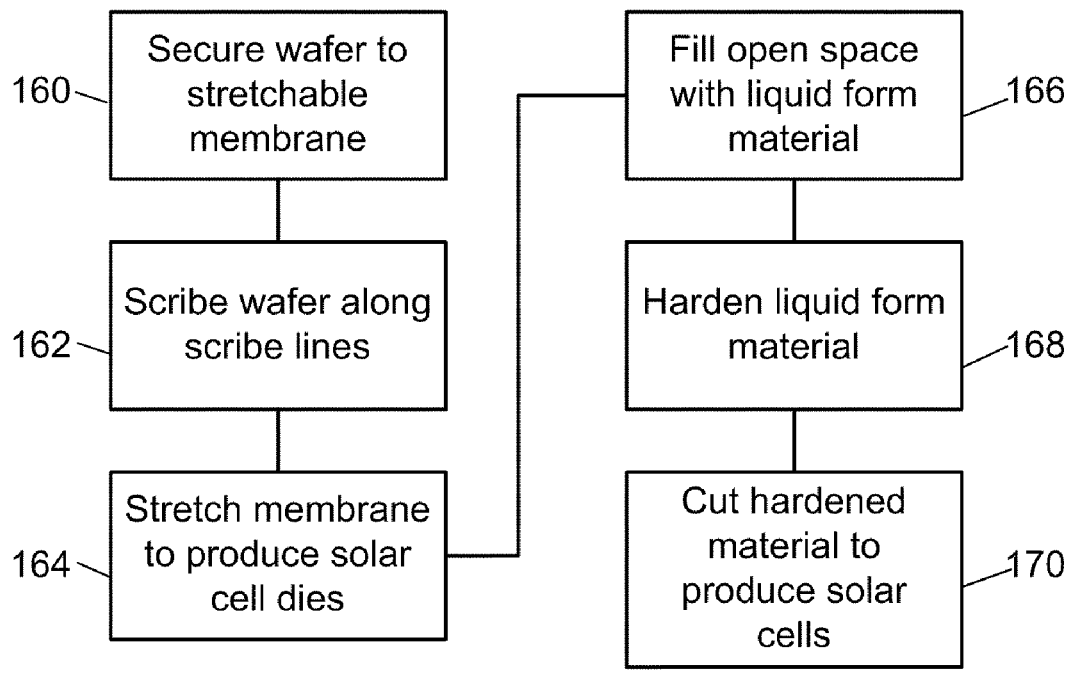
FIG. 29 shows another exemplary method of the present disclosure.

FIG. 29 shows, in the form of a flow chart, another exemplary method of manufacturing a solar cell. At step 160, a semiconductor wafer is secured to a stretchable membrane, which is then stretched and secured to an expander. The stretchable membrane is sometimes referred to a "blue tape" or UV tape (for ultra-violet activated tape release) in the semiconductor industry. At step 162, the semiconductor wafer is scribed along its scribe lines. At step 164, the expander further expands the stretchable membrane, which causes the semiconductor wafer to separate into solar cell dies, each solar cell die being separated from its neighbor solar cell dies by open space. At step 166, the open space between solar cells is filled with a liquid form material. At step 168, the liquid form material is cured (e.g., thermal curing, photo-curing, etc.) or otherwise hardened to obtain hardened material. At step 170, the hardened material is cut to produce a plurality of solar cells. Such solar cells were shown above at FIG. 14. The liquid form material can include, for example, BCB, PMMA, and PVC. Variations of the method of FIG. 29 can be made without departing from the scope of the present invention. For example, deposition of a metal layer 110, an insulator layer 130, or both, can be effected between steps 168 and step 170 to form solar cells such as described in relation to FIGS. 12, 16, and 17.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A solar cell made of semiconductor materials, the solar cell having a crystalline structure with crystal planes, the solar cell comprising:
   a germanium substrate;
   a least one p-n junction formed atop the germanium substrate, the at least one p-n junction including one or more group III elements and one or more group V elements;
   a solar cell window layer formed atop the at least one p-n junction;
   a patterned cap layer formed atop the solar cell window layer, the patterned cap layer being electrically connected to the solar cell window layer, the patterned cap layer exposing a light-input portion of the solar cell window layer;
   a sidewall extending along a height of the cap layer and towards the germanium substrate, the sidewall having a cleaved surface, the cleaved surface being parallel to a cleaving plane of the solar cell, the cleaving plane being parallel to a crystal plane of the solar cell, the crystal plane being a plane of a (110) family of planes of the crystalline structure;
   a side piece adjacent the sidewall, the side piece being a semi-insulating silicon side piece; and
   a metal layer formed on a portion of the patterned cap layer and on a portion of the side piece, the metal layer defining a busbar of the solar cell, the busbar bridging the side piece and the patterned cap layer.

2. The solar cell of claim 1 further comprising a metal layer formed on a portion of the patterned cap layer.

3. The solar cell of claim 2 wherein a portion of the metal layer defines a busbar of the solar cell.

4. The solar cell of claim 3 wherein the solar cell window layer includes aluminum indium phosphide, the cap layer includes gallium arsenide, and at least one of the at least one p-n junction includes indium gallium arsenide.

5. The solar cell of claim 4 wherein the patterned cap layer further includes indium.

6. The solar cell of claim 1 wherein the at least one p-n junction, the solar cell window layer, and the patterned cap layer are pseudomorphic with the germanium substrate.

7. The solar cell of claim 1 wherein the germanium substrate is a vicinal substrate having a vicinal angle comprised between 0° and 20°.

* * * * *